(12) United States Patent
Takeuchi

(10) Patent No.: US 8,633,723 B2
(45) Date of Patent: Jan. 21, 2014

(54) SEMICONDUCTOR APPARATUS

(75) Inventor: Shigeyuki Takeuchi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 349 days.

(21) Appl. No.: 13/024,669

(22) Filed: Feb. 10, 2011

(65) Prior Publication Data

US 2011/0198587 A1  Aug. 18, 2011

(30) Foreign Application Priority Data

Feb. 18, 2010  (JP) ................................. 2010-033330

(51) Int. Cl.
  *G01R 31/3187*  (2006.01)
(52) U.S. Cl.
  USPC ............. 324/750.3; 327/540; 327/541; 374/1
(58) Field of Classification Search
  USPC ..................... 324/750.3; 374/1; 327/540, 541
  See application file for complete search history.

(56) References Cited

U.S. PATENT DOCUMENTS 7,798,703 B2 * 9/2010 Vollertsen ..................... 374/1
2005/0286194 A1  12/2005 Fujiki et al.

FOREIGN PATENT DOCUMENTS

| JP | 09-162391 A | | 6/1997 |
| JP | 2006-012960 A | | 1/2006 |
| JP | 2006012960 A | * | 1/2006 |
| JP | 2006-278772 A | | 10/2006 |

\* cited by examiner

*Primary Examiner* — Patrick Assouad
*Assistant Examiner* — Sean Curtis
(74) *Attorney, Agent, or Firm* — Rossi, Kimms & McDowell LLP

(57) ABSTRACT

A semiconductor apparatus according to aspects of the invention includes a power MOSFET including a main MOSFET and sensing MOSFET's. The main MOSFET and the sensing MOSFET's are formed on a semiconductor substrate, and a sensing MOSFET is selected for changing the sensing ratio and further for confining the sensing ratio variations within a certain narrow range stably from a low main current range to a high main current range. A semiconductor apparatus according to aspects of the invention facilitates reducing the manufacturing costs thereof, obviating the cumbersomeness caused in the use thereof, and confining the sensing ratio variations within a certain narrow range stably.

7 Claims, 26 Drawing Sheets

SEMICONDUCTOR APPARATUS

FIELD OF THE INVENTION

Embodiments of the present invention relate to semiconductor apparatuses such as a MOS-gate field-effect transistor (hereinafter referred to as a "power MOSFET") and an insulated-gate bipolar transistors (hereinafter referred to as an "IGBT") which include a sensing device for measuring the main current value thereof.

BACKGROUND

As the electronic techniques have been employed more widely in automobiles, various kinds of semiconductor apparatuses are used. It is required to control the main current of the semiconductor apparatuses precisely irrespective of whether the value thereof is small or large.

For measuring the main current, a small sensing MOSFET and a power MOSFET are mounted on a same semiconductor substrate and the main current value is measured from the value of the current that flows through the sensing MOSFET. In detail, the current that flows through the sensing MOSFET is made to flow through a sensing resistance and the main current value is measured from the voltage drop cause across the sensing resistance.

FIG. 22 is a top plan view of conventional power MOSFET 700 that includes a sensing MOSFET. FIG. 23 is a cross sectional view of conventional power MOSFET 700.

Referring now to FIGS. 22 and 23, conventional power MOSFET 700 includes chip 96, on which main gate electrode pad 8 is formed. Main gate electrode pad 8 is connected to source electrode 80 of main MOSFET 91, source electrode 81 of sensing MOSFET 92 and gate electrode 6 of main MOSFET 91 via gate wiring 7.

The ratio of the current $I_O$ that flows through main MOSFET 91 and the current $I_S$ that flows through sensing MOSFET 92 is the sensing ratio ($I_O/I_S$).

The design value of the sensing ratio is determined by the ratio of the total area of n$^+$ source layer 5 in main MOSFET 91 and the total area of n$^+$ source layer 5 in sensing MOSFET 92.

FIG. 24 is a circuit diagram of conventional power MOSFET 700 that includes a sensing MOSFET.

Referring now to FIG. 24, power MOSFET 700 includes main MOSFET 91 that makes a main current flow and sensing MOSFET 92 that detects the main current made to flow by main MOSFET 91. Drain electrode 13 of main MOSFET 91 and sensing MOSFET 92 is connected to high potential side 75 of a power supply via drain terminal 18. Source terminal 85 of main MOSFET 91 is connected to load 71 such as a resistive load and an inductive load. Load 71 is connected to ground 76 of the power supply. Source terminal 86 of sensing MOSFET 92 is connected to sensing resistance 72. Sensing resistance 72 is connected to ground 76 of the power supply. The gates of main MOSFET 91 and sensing MOSFET 92 are connected to gate wiring 7. Gate wiring 7 is connected to control circuit 74 via gate electrode pad 8 and main gate terminal 14.

The sensing current $I_S$ that flows through sensing MOSFET 92 flows to ground 76 through sensing resistance 72. The voltage drop caused across sensing resistance 72 by the sensing current $I_S$ is fed to detector circuit 73. By the signal fed from detector circuit 73, the main current $I_O$ of power MOSFET 700 is controlled through control circuit 74.

In FIG. 23, n$^+$ drain layer 1, n$^-$ drift layer 2, p$^-$ well layer 3, trench 4, interlayer insulator film 9, and unit cell 43 are shown. In FIG. 22, casing 97 is shown.

Now the operations of power MOSFET 700 will be described below.

The main current $I_O$ flows from the power supply to main MOSFET 91 and to load 71. As the main current $I_O$ flows to load 71, the sensing current $I_S$ flows through sensing MOSFET 92 and through sensing resistance 72.

If the total area of n$^+$ source region 5 in sensing MOSFET 92 is set to be 1/10000 times as wide as the total area of n$^+$ source region 5 in main MOSFET 91, the sensing current $I_S$ will be 1/10000 times as large as the main current $I_O$. Therefore, the sensing ratio ($I_O/I_S$) will be 10000. By feeding the voltage drop caused across sensing resistance 72 by the sensing current $I_S$ to detector circuit 73, the main current value $I_O$ of main MOSFET 91 is measured. The ratio between the total area of n$^+$ source region 5 in main MOSFET 91 and the total area of n$^+$ source region 5 in sensing MOSFET 92 provides the design value of the sensing ratio.

FIG. 25 illustrates the relation between the sensing ratio and the main current of the main MOSFET.

As described above, the sensing ratio is the ratio ($I_O/I_S$) between the main current $I_O$ that flows through main MOSFET 91 and the sensing current $I_S$ that flows through sensing MOSFET 92. Sensing ratio variations increase as the main current $I_O$ becomes smaller as described in FIG. 25, unstabilizing the sensing ratio. In other words, the sensing ratio deviates more from a certain value, as the main current $I_O$ becomes smaller.

When the main current $I_O$ is around 10 A or higher in FIG. 25, the sensing ratio is stable, exhibiting only small deviations. When the main current $I_O$ is small, e.g. several A, large deviations are caused in the sensing ratio, the sensing ratio does not exhibit a certain value, and the sensing ratio is unstable. If the sensing ratio is unstable, it will be impossible to determine the current flowing to load 71 precisely. To obviate this problem, a power MOSFET, the sensing ratio thereof being small, is selected according to the prior art in the case, in which the current level of load 71 is low.

The following Patent Document 1 discloses a semiconductor apparatus that includes a power MOS transistor and a current detecting transistor that detects the current of the power MOS transistor and generates a detection signal fed to an external control circuit. The semiconductor apparatus disclosed in the Patent Document 1 includes also a protector circuit that causes a lowering of the gate voltage of the power MOS transistor, when a current higher than a predetermined value flows through the power MOS transistor. The semiconductor apparatus disclosed in the Patent Document 1 includes the power MOS transistor, the current detecting transistor, and the devices constituting the protector circuit mounted on the same semiconductor chip. The Patent Document 1 discloses also a control system employing the semiconductor apparatus.

The following Patent Document 2 discloses a semiconductor apparatus that includes a gate electrode pad and a driving region, divided into a same number of constituent gate electrode pads and the same number of constituent driving regions, respectively. The constituent driving regions used are changed depending on the driving conditions to reduce the losses.

DOCUMENTS DESCRIBING THE RELATED ART

Patent Documents

[Patent Document 1] Japanese Unexamined Patent Application Publication No. 2006-12960

[Patent Document 2] Japanese Unexamined Patent Application Publication No. 2006-278772

If one wants to select power MOSFET 700 that includes sensing MOSFET 92 suitable to the load 71 current level, it will be necessary to prepare many kinds of power MOSFET's 700, increasing the manufacturing costs thereof. In using power MOSFET's 700, it is necessary to select suitable power MOSFET 700 considering the load 71 current level, complicating the works of assembling a power converter.

The Patent Documents 1 and 2 do not describe anything on the semiconductor apparatus capable of dividing the main current into a plurality of ranges, disposing main switching devices and sensing switching devices corresponding to the divided main current ranges, and selecting a combination of a main switching device and a sensing switching device to stabilize the sensing ratio.

In view of the foregoing, it would be desirable to obviate the problems described above. It would be also desirable to provide a semiconductor apparatus manufactured with low manufacturing costs. It would be further desirable to provide a semiconductor apparatus that facilitates getting rid of cumbersomeness in the use thereof, suppressing the variations of the sensing ratio to be small from a low main current range to a high current range, and stabilizing the sensing ratio.

SUMMARY OF THE INVENTION

According to aspects of the invention, there is provided a semiconductor apparatus including:

a semiconductor substrate; a main semiconductor device on the semiconductor substrate, the main semiconductor device making a main current flow;

a sensing semiconductor device on the semiconductor substrate, the sensing semiconductor device making a sensing current flow for measuring the main current; and at least a plurality of the main semiconductor devices exhibiting different current capacities or a plurality of the sensing semiconductor devices exhibiting different current capacities.

According to the subject matter of to aspects of the invention, a combination of the plurality of the main semiconductor devices and the sensing semiconductor device, a combination of the main semiconductor device and the plurality of the sensing semiconductor devices, or a combination of the plurality of the main semiconductor devices and the plurality of the sensing semiconductor devices is selected for setting the sensing ratio that is a ratio between the main current and the sensing current to be constant in the main current range used.

According to the subject matter of to aspects of the invention, the main semiconductor device is a main MOS transistor that is a main MOSFET or a main IGBT; the sensing semiconductor device is a sensing MOS transistor that is a sensing MOSFET or a sensing IGBT; and the design value of the sensing ratio is determined by the ratio between the total area of a source layer or an emitter layer in the main MOS transistor and the total area of a source layer or an emitter layer in the sensing MOS transistor.

According to the subject matter of to aspects of the invention, the semiconductor apparatus includes the main MOS transistor; two pieces of the sensing MOS transistors, the current capacities thereof are different from each other; a gate electrode pad common to the main and sensing MOS transistors; a drain electrode or a collector electrode common to the main and sensing MOS transistors; a source electrode or an emitter electrode of the main MOS transistor; source electrodes or emitter electrodes of the two pieces of the sensing MOS transistors; and five terminals connected to the drain electrode or the collector electrode, the source electrodes or the emitter electrodes, and the gate electrode pad.

According to the subject matter of to aspects of the invention, the semiconductor apparatus includes the main MOS transistor; two pieces of the sensing MOS transistors, the current capacities thereof are different from each other; a gate electrode pad of the main MOS transistor; gate electrode pads of the two pieces of the sensing MOS transistors; a drain electrode or a collector electrode common to the main and sensing MOS transistors; a source electrode or an emitter electrode of the main MOS transistor; a source electrode or an emitter electrode common to the two pieces of the sensing MOS transistors; and six terminals connected to the drain electrode or the collector electrode, the source electrodes or the emitter electrodes, and the gate electrode pads.

According to the subject matter of to aspects of the invention, the semiconductor apparatus includes two pieces of the main MOS transistors, the current capacities thereof are different from each other; the sensing MOS transistor; a gate electrode pad common to the main and sensing MOS transistors; a drain electrode or a collector electrode common to the main and sensing MOS transistors; source electrodes or emitter electrodes of the two pieces of the main MOS transistors; a source electrode or an emitter electrode of the sensing MOS transistor; and five terminals connected to the drain electrode or the collector electrode, the source electrodes or the emitter electrodes, and the gate electrode pad.

According to the subject matter of the to aspects of the invention, the semiconductor apparatus includes two pieces of the main MOS transistors, the current capacities thereof are different from each other; the sensing MOS transistor; gate electrode pads of the two pieces of the main MOS transistors; a gate electrode pad of the sensing MOS transistor; a drain electrode or a collector electrode common to the main and sensing MOS transistors; a source electrode or an emitter electrode common to the two pieces of the main MOS transistors; a source electrode or an emitter electrode of the sensing MOS transistor; and six terminals connected to the drain electrode or the collector electrode, the source electrodes or the emitter electrodes, and the gate electrode pads.

According to the subject matter of to aspects of the invention, the semiconductor apparatus includes two pieces of the main MOS transistors, the current capacities thereof are different from each other; two pieces of the sensing MOS transistors, the current capacities thereof are different from each other; a gate electrode pad common to the main and sensing MOS transistors; a drain electrode or a collector electrode common to the main and sensing MOS transistors; source electrodes or emitter electrodes of the two pieces of the main MOS transistors; source electrodes or emitter electrodes of the two pieces of the sensing MOS transistors; and six terminals connected to the drain electrode or the collector electrode, the source electrodes or the emitter electrodes, and the gate electrode pad.

According to the subject matter of to aspects of the invention, the semiconductor apparatus includes two pieces of the main MOS transistors, the current capacities thereof are different from each other; two pieces of the sensing MOS transistors, the current capacities thereof are different from each other; gate electrode pads of the two pieces of the main MOS transistors; gate electrode pads of the two pieces of the sensing MOS transistors; a drain electrode or a collector electrode common to the main and sensing MOS transistors; a source electrode or an emitter electrode common to the two pieces of the main MOS transistors; a source electrode or an emitter electrode common to the two pieces of the sensing MOS transistors; and seven terminals connected to the drain electrode or the collector electrode, the source electrodes or the emitter electrodes, and the gate electrode pads.

According to aspects of the invention, a plurality of the main MOSFET's and/or a plurality of the sensing MOSFET's is disposed, and a combination of the plurality of the main MOSFET's and the sensing MOSFET, a combination of the main MOSFET and the plurality of the sensing MOSFET's, or a combination of the plurality of the main MOSFET's and the plurality of the sensing MOSFET's is selected depending on the main current range. According to the invention, the sensing ratio variations will be confined within a certain narrow range stably, even if a power MOSFET is used in a wide main current range.

According to aspects of the invention, it is not necessary to select a power MOSFET considering the current level of the load as according to the prior art. Since it is not necessary to manufacture power MOSFET's considering the current level, the manufacturing costs are reduced and the cumbersomeness caused in using the power MOSFET's is obviated.

DETAILED DESCRIPTION OF CERTAIN EMBODIMENTS

Figure 1:
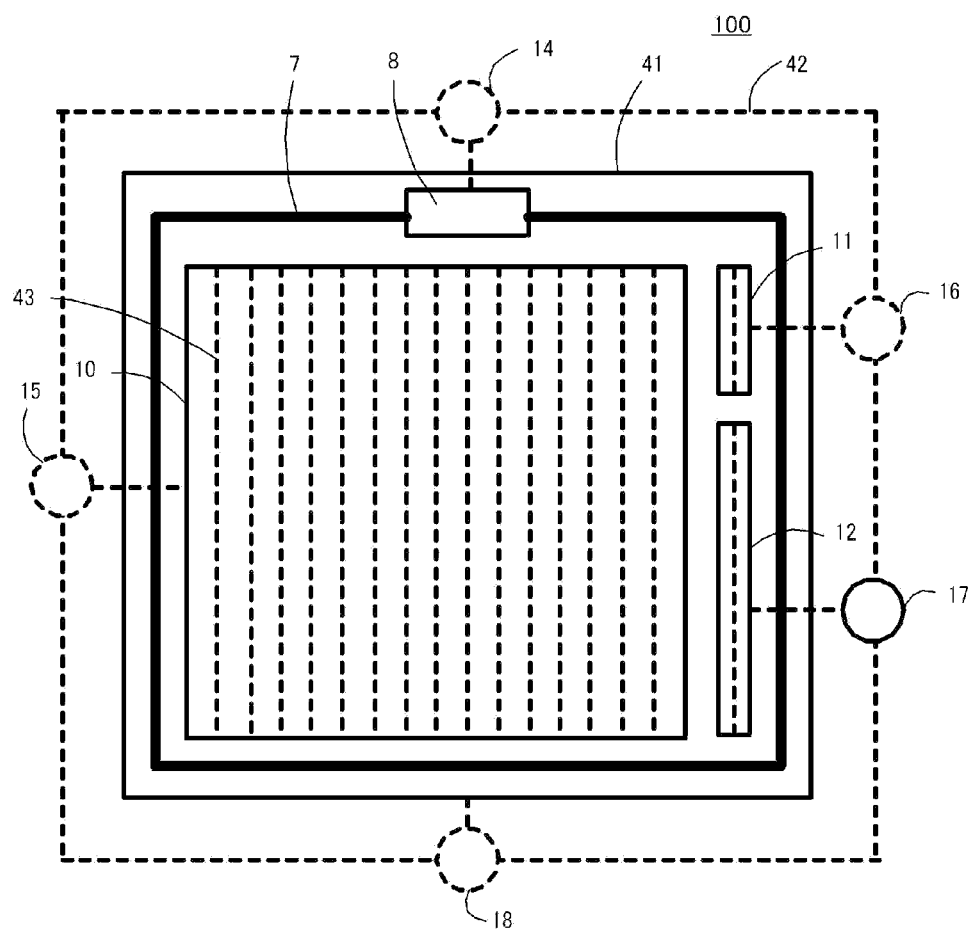
FIG. 1 is the top plan view of a semiconductor apparatus according to a first embodiment of the invention.

Now the invention will be described in detail below with reference to the accompanied drawings which illustrate the preferred embodiments of the invention. In the following descriptions and the drawings which illustrate the preferred embodiments, the same reference numerals as used in FIG. 22 through 25 are used to designate the same constituent elements and their duplicated descriptions are not made for the sake of simplicity.

First Embodiment

Figure 2:
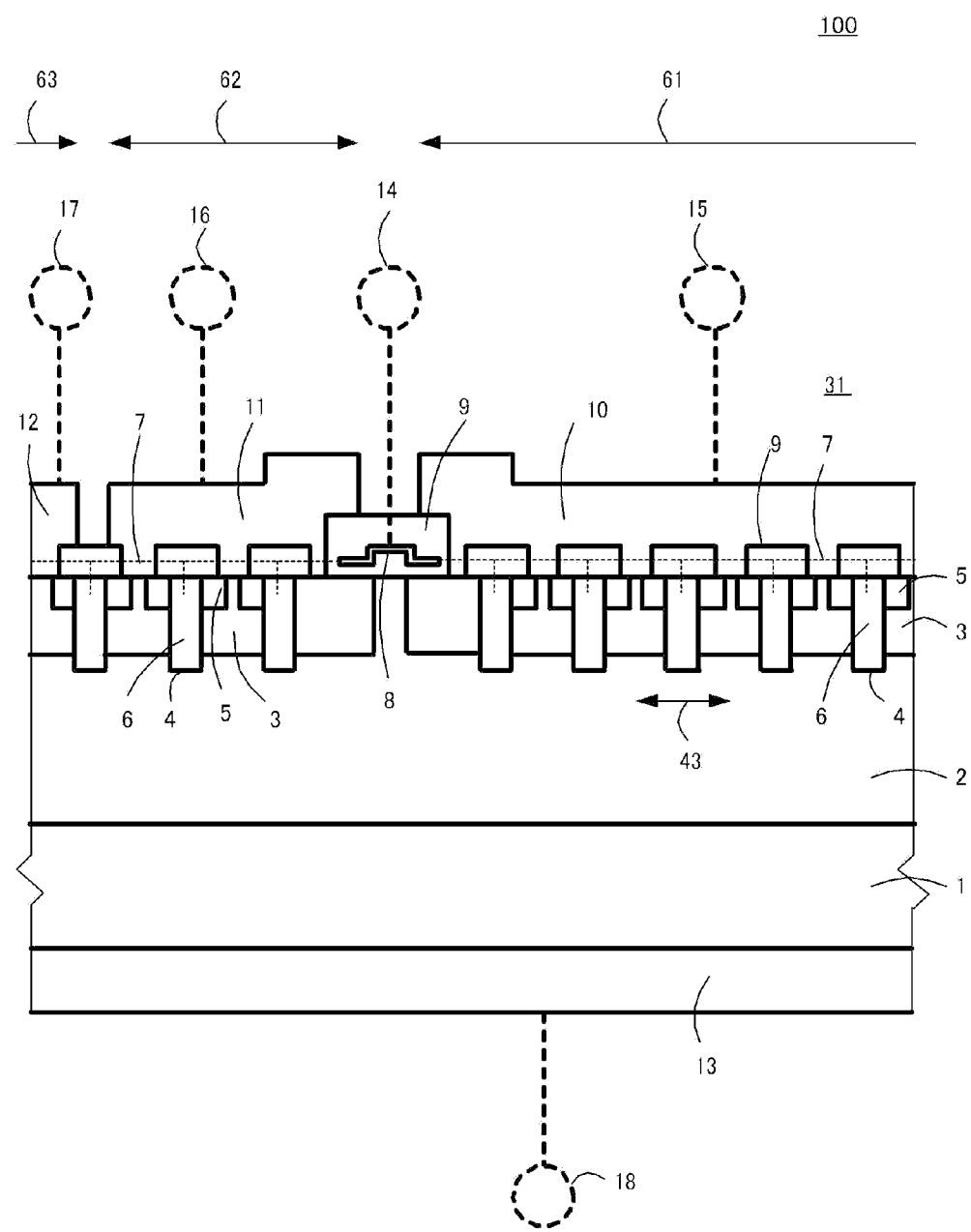
FIG. 2 is the cross sectional view of the semiconductor apparatus according to the first embodiment.

FIG. 1 is the top plan view of a semiconductor apparatus according to a first embodiment of the invention. FIG. 2 is the cross sectional view of the semiconductor apparatus according to the first embodiment.

The semiconductor apparatus according to the first embodiment of the invention is power MOSFET 100 including sensing MOSFET's. The broken lines surrounding the outer edges of chip 41 in FIG. 1 represent casing 42 housing chip 41 therein. The broken lines shown in main source electrode 10, first source electrode 11, and second source electrode 12 represent unit cell 43. As shown in FIG. 2, unit cell 43 is formed of $n^+$ drain layer 1 ($n^+$ semiconductor substrate), $n^-$ drift layer 2 ($n^-$ epitaxial layer), $p^-$ well layer 3, $n^+$ source layer 5, and gate electrode 6 formed in trench 4. Unit cell 43 is formed in the same manner in main MOSFET 61, first sensing MOSFET 62, and second sensing MOSFET 63 described later.

Figure 3:
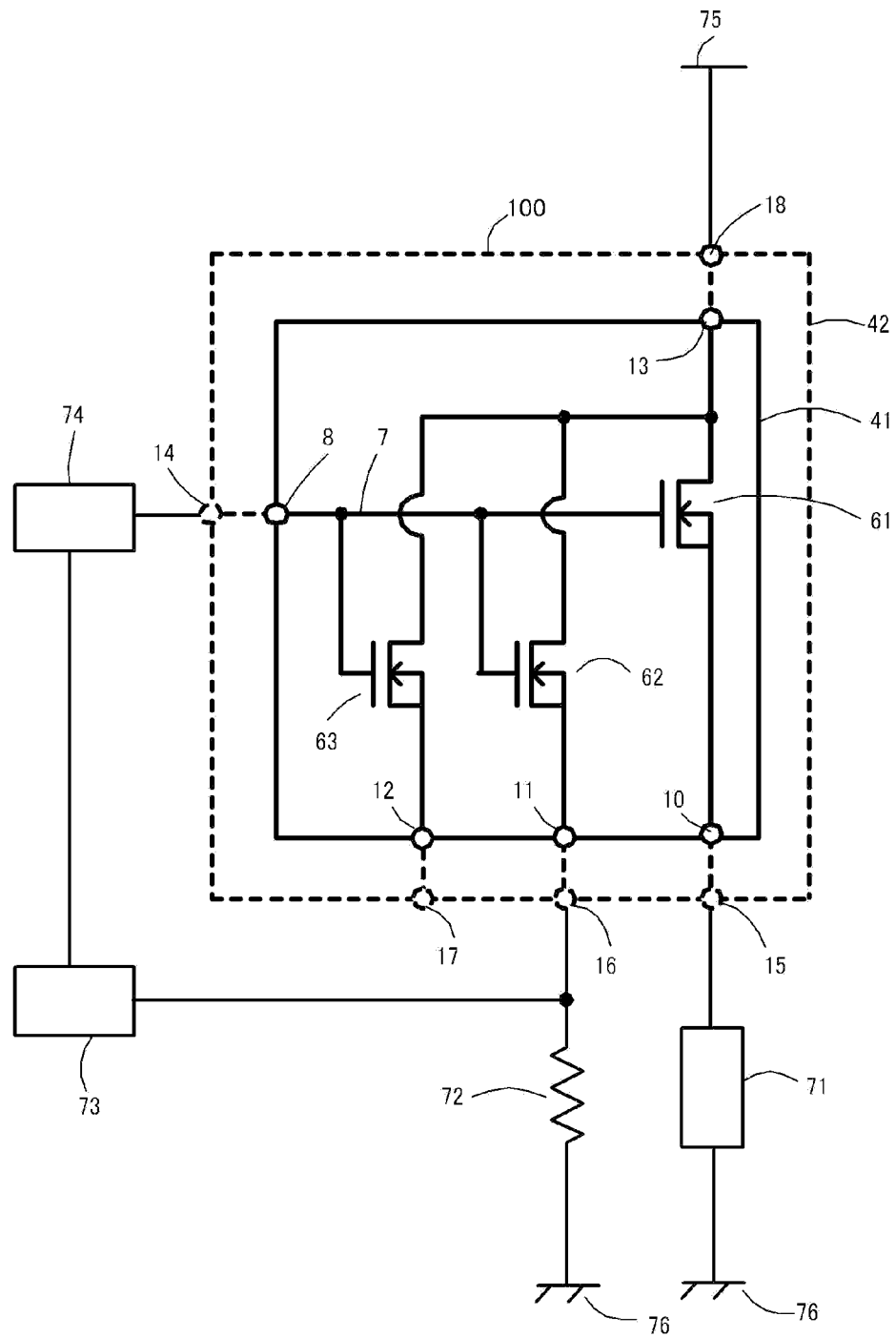
FIG. 3 is an equivalent circuit diagram of power MOSFET 100 in FIGS. 1 and 2.

FIG. 3 is an equivalent circuit diagram of power MOSFET 100 in FIGS. 1 and 2. In FIG. 3, load 71, sensing resistance 72, detector circuit 73, and control circuit 74 connected to the outside of power MOSFET 100 are shown.

In FIGS. 1 and 2, main MOSFET 61 includes an $n^+$ semiconductor substrate working as $n^+$ drain layer 1, an $n^-$ epitaxial layer working as $n^-$ drift layer 2 on the $n^+$ semiconductor substrate, $p^-$ well layer 3 on the $n^-$ epitaxial layer, and trench 4 bored through $p^-$ well layer 3. In the surface portion of $p^-$ well layer 3, $n^+$ source layer 5 is formed in contact with trench 4. Gate electrode 6 is formed aside $p^-$ well layer 3 between $n^+$ source layer 5 and the $n^-$ epitaxial layer ($n^-$ drift layer 2) with a not-shown insulator film interposed between gate electrode 6 and $p^-$ well layer 3. Main source electrode 10 is formed on $n^+$ source layer 5 and $p^-$ well layer 3. Drain electrode 13 is formed on $n^+$ drain layer 1 working as an $n^+$ semiconductor substrate. Gate electrode 6 is connected to main gate electrode pad 8 via gate wiring 7 (gate runner).

In first and second sensing MOSFET's 62 and 63, an $n^-$ epitaxial layer ($n^-$ drift layer 2) is formed on an $n^+$ semiconductor substrate ($n^+$ drain layer 1). In the surface portion of the $n^-$ epitaxial layer, $p^-$ well layer 3 is formed. Trench 4 is formed through $p^-$ well layer 3. In the surface portion of $p^-$ well layer 3, n⁺ source layer 5 is formed in contact with trench 4. Gate electrode 6 is formed aside p⁻ well layer 3 between n⁺ source layer 5 and the n⁻ epitaxial layer (n⁻ drift layer 2) with a not-shown insulator film interposed between gate electrode 6 and p⁻ well layer 3. First source electrode 11 and second source electrode 12 are formed on n⁺ source layer 5 and p⁻ well layer 3. Drain electrode 13 common to main MOSFET 61 and sensing MOSFET's 62 and 63 is formed on n⁺ drain layer 1 that is the n⁺ semiconductor substrate. Gate electrode 6 is connected to gate electrode pad 8 on main MOSFET 61 via gate wiring 7.

The total area of n⁺ source layer 5 in first sensing MOSFET 62 is set to be 1/10000 times as wide as the total area of n⁺ source layer 5 in main MOSFET 61. The total area of n⁺ source layer 5 in second sensing MOSFET 63 is set to be 1/1000 times as wide as the total area of n⁺ source layer 5 in main MOSFET 61. The design value of the sensing ratio is 10000, when first sensing MOSFET 62 is used. The design value of the sensing ratio is 1000, when second sensing MOSFET 63 is used.

The source layer area is the area of each source layer in the semiconductor substrate surface. Since the unit cells in main MOSFET 61, first sensing MOSFET 62, and second sensing MOSFET 63 are structured in the same manner, it is possible to design the sensing ratios by means of the source area ratios.

In FIG. 3, main source electrode 10 in main MOSFET 61 is connected to load 71 via main source terminal 15. The other terminal of load 71 is connected to the low potential side (ground 76) of a power supply. Drain electrode 13 is connected to high potential side 75 of the power supply via drain terminal 18. Main gate electrode pad 8 is connected to control circuit 74 via main gate terminal 14.

In the case, in which main MOSFET 61 is used in the current range between 10 A and 100 A, first sensing MOSFET 62 is employed. First source electrode 11 in first sensing MOSFET 62 is connected to sensing resistance 72 via first source terminal 16. The other end of sensing resistance 72 is connected to ground 76. The connection point of first source terminal 16 of first sensing MOSFET 62 and sensing resistance 72 is connected to detector circuit 73. Gate electrode 6 (not shown) in first sensing MOSFET 62 is connected to main gate terminal 14 via main gate electrode pad 8.

In the case, in which main MOSFET 61 is used in the range current between 1 A and 10 A, second sensing MOSFET 63 is employed. Second source electrode 12 in second sensing MOSFET 63 is connected to sensing resistance 72 via second source terminal 17. The other end of sensing resistance 72 is connected to ground 76. The connection point of second source terminal 17 of second sensing MOSFET 63 and sensing resistance 72 is connected to detector circuit 73. Gate electrode 6 (not shown) in second sensing MOSFET 63 is connected to main gate terminal 14 via main gate electrode pad 8.

Therefore, the semiconductor apparatus according to the first embodiment is power MOSFET 100 that includes five terminals including one gate terminal (main gate terminal 14), three source terminals (main source terminal 10, first source terminal 11, and second source terminal 12), and one drain terminal (drain terminal 18).

In packaging chip 41 with a resin and such a sealant, chip 41 is housed in casing 42 provided with terminals 14, 15, 16, 17, and 18 led outside corresponding to electrodes pads 8, 10, 11, 12, and 13 on chip 41. Electrode pads 8, 10, 11, 12, and 13 are connected to terminals 14, 15, 16, 17, and 18, respectively, resulting in MOSFET 100 packaged in casing 42. In this example, terminal 16 or 17 led outside is selected and connected to sensing resistance 72 or terminals 16 and 17 are connected in parallel to sensing resistance 72 to select a desired sensing ratio.

Alternatively, a sensing ratio may be selected in housing chip 41 in casing 42. For example, chip 41 is housed in casing 42 provided with terminals 14, 15, and 18 led outside corresponding to electrode pads 8, 10 and 13 and terminal 16 corresponding to electrode pads 11 and 12. In the alternative example, terminal 17 is omitted from FIG. 3.

Corresponding to a desired sensing ratio, it is effective to connect electrode pad 11 or 12 or electrode pads 11 and 12 to terminal 16 and to house chip 41 in casing 42.

Figure 26:
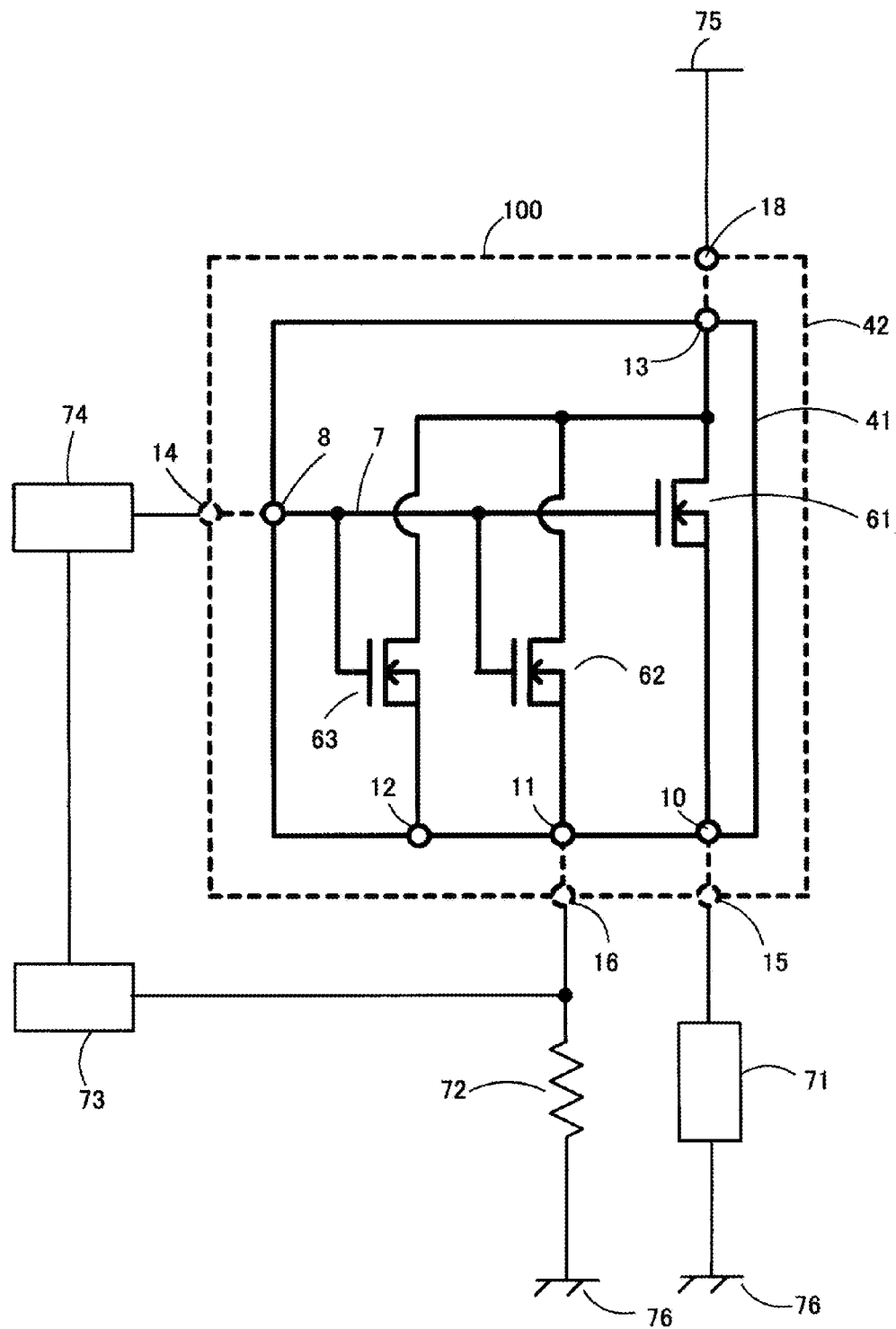
FIG. 26 is an equivalent circuit diagram showing a modification of power MOSFET 100 shown in FIGS. 1 and 2.

FIG. 26 is an equivalent circuit diagram showing a modification of power MOSFET 100 shown in FIGS. 1 and 2.

In FIG. 26, terminal 17 is omitted from the circuit shown in FIG. 3. In FIG. 26, electrode 11 is connected to terminal 16, for example, by a wire bonding. If one wants to select electrode 12, electrode 12 and terminal 16 are connected to each other and, then, chip 41 is housed in casing 42.

In the case, in which chip 41 is mounted on a lead frame (not shown) and sealed with a resin, it is possible for the former example to select a sensing ratio after the sealing. It is possible for the latter example to reduce the terminal (lead) led outside.

Load 71, sensing resistance 72, detector circuit 73, and control circuit 74 connected to power MOSFET 100 are disposed outside power MOSFET 100. In many cases, these external constituent elements are connected to power MOSFET 100, when power MOSFET 100 is used. Although the first embodiment of the invention has been described in connection with power MOSFET 100, an IGBT may be employed in substitution for power MOSFET 100 with no problem. In the case of an IGBT, source terminals 15, 16, and 17 are replaced by an emitter terminal or emitter terminals and drain terminal 18 by a collector terminal.

Power MOSFET 100 is used in the following manner.

When the main current $I_O$ that flows through main MOSFET 61 to load 71 falls in the range between 10 A and 100 A, first sensing MOSFET 62 is employed. Since the ratio between the total area of n⁺ source layer 5 in main MOSFET 61 and the total area of n⁺ source layer 5 in first sensing MOSFET 62 is 10000:1, the sensing ratio design value is 10000.

Figure 4:
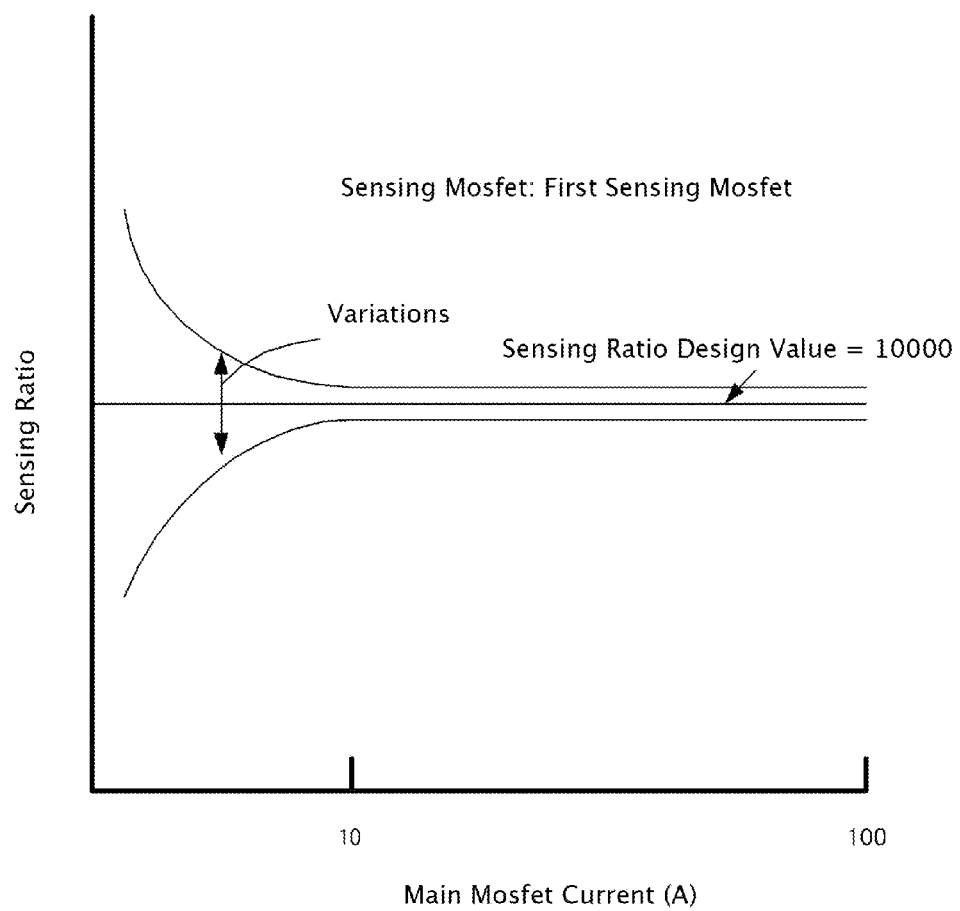
FIG. 4 illustrates the relation between the sensing ratio and the main current $I_O$ of the main MOSFET in the case, in which a first sensing MOSFET is used.

FIG. 4 illustrates the relation between the sensing ratio and the main current $I_O$ of the main MOSFET in the case, in which the first sensing MOSFET is used.

When the main current $I_O$ is in the range between 10 A and 100 A, the sensing current $I_S1$ that flows through first sensing MOSFET 62 is in the range between 0.001 A and 0.01 A. In the $I_S1$ range described above, the sensing ratio variations are confined stably in a certain narrow range. In other words, the sensing ratio exhibits a certain value stably. Therefore, it is possible to measure the main current $I_O$ that flows to load 71 very precisely. Here, "The sensing ratio exhibits a certain value." implies that the sensing ratio is constant in the main current range used and that the sensing ratio does not exhibit any current dependence.

If sensing resistance 72 is set to be 100Ω, the voltage fed to detector circuit 73 is from 0.1 V to 1.0 V, that makes detector circuit 73 operate stably.

In the case, in which the current $I_O$ that flows through main MOSFET 61 to load 71 is in the range between 1 A and 10 A, second sensing MOSFET 63 is employed. Since the target value of the sensing ratio is 1000, the sensing current $I_S2$ in the range between 0.001 A and 0.01 A flows through second sensing MOSFET 63.

Figure 5:
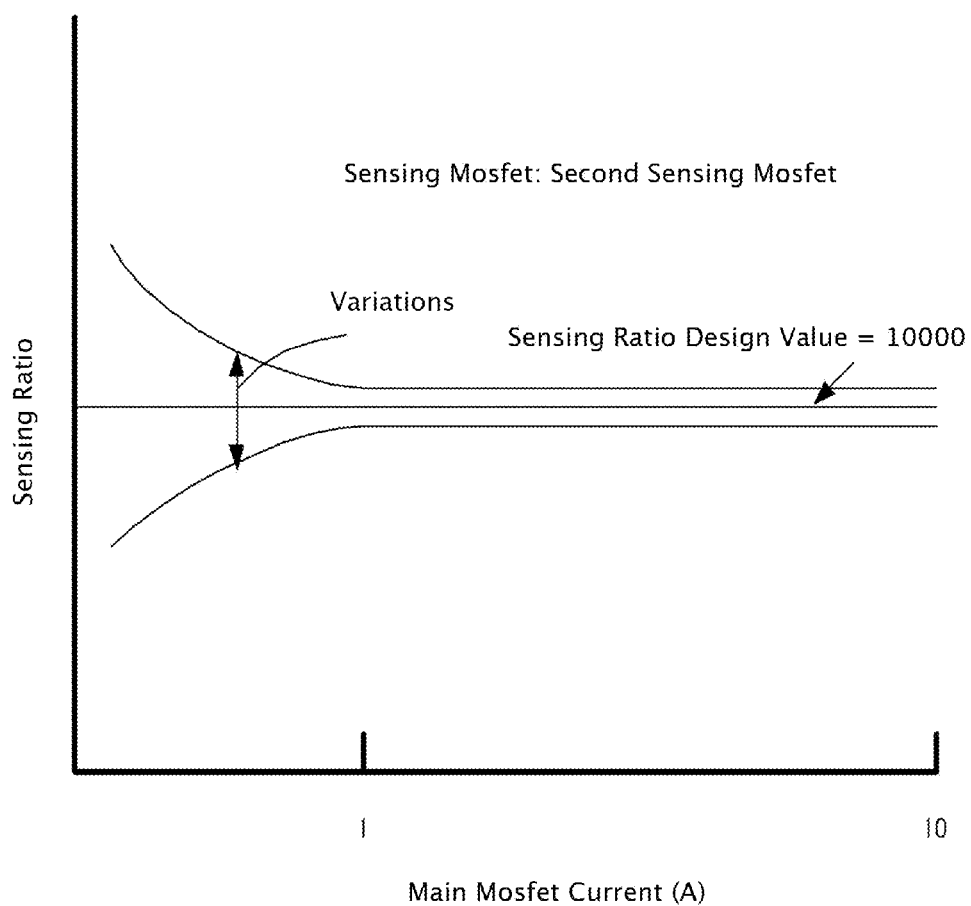
FIG. 5 illustrates the relation between the sensing ratio and the main current $I_O$ of the main MOSFET in the case, in which a second sensing MOSFET is used.

FIG. 5 illustrates the relation between the sensing ratio and the main current $I_O$ of the main MOSFET in the case, in which the second sensing MOSFET is used.

When the main current $I_O$ is in the range between 1 A and 10 A, the sensing current $I_S2$ that flows through second sensing MOSFET 63 is in the range between 0.001 A and 0.01 A. In the $I_S2$ range described above, the sensing ratio variations are confined stably in a certain narrow range. Since the sensing ratio is stable, it is possible to measure the main current $I_O$ that flows to load 71 very precisely.

Figure 6:
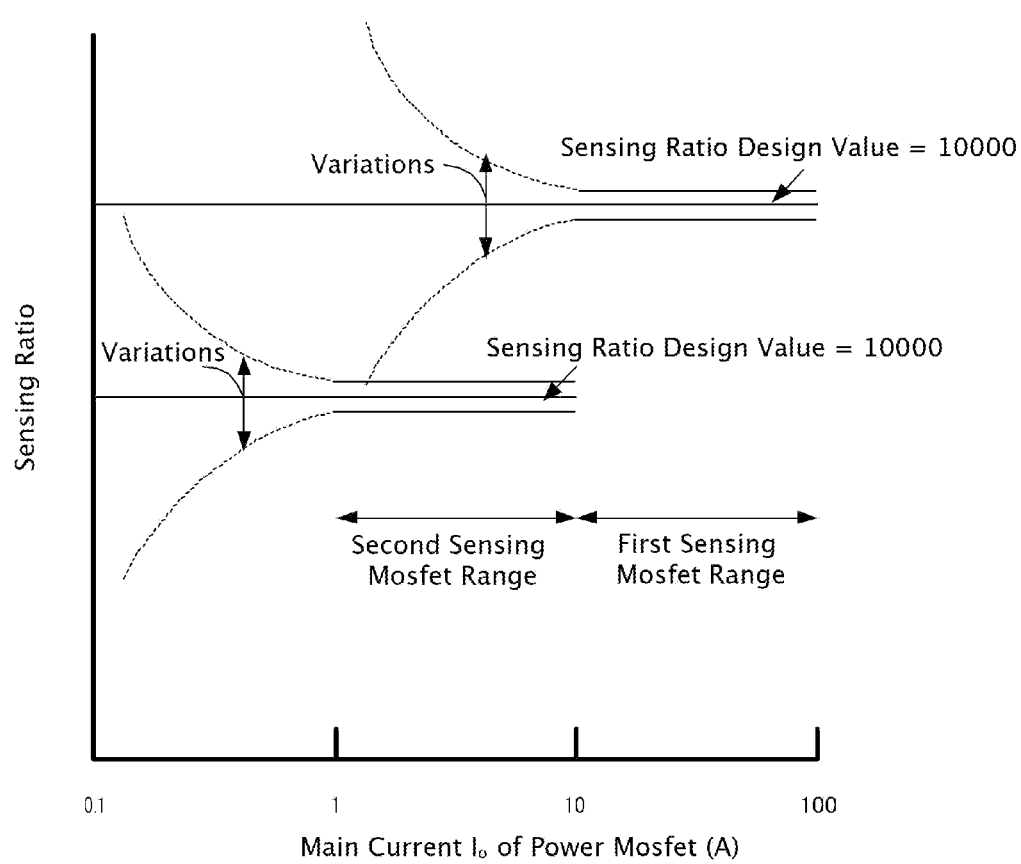
FIG. 6 illustrates the relations between the sensing ratios and the main current $I_O$ of the main MOSFET in the case, in which the first sensing MOSFET or the second sensing MOSFET is used selectively.

By selecting sensing MOSFET 62 or 63 depending on the main current level, the sensing ratio variations are confined stably in a certain narrow range by one power MOSFET 100 in a wide current range (between 1 A and 100 A) as described in FIG. 6. Since the sensing ratio is stable, it is possible to measure the main current $I_O$ that flows to load 71 very precisely.

As a result, the cumbersomeness caused in assembling an electric power converter is reduced. Since it becomes unnecessary to manufacture various kinds of power MOSFET's, the current capacities thereof are different from each other, and since it becomes possible to manufacture many same power MOSFET's, the manufacturing costs thereof are reduced.

By employing further more sensing MOSFET's, it is possible to narrow the current range assigned to each sensing MOSFET. Therefore, it is possible to confine the sensing ratio variations stably in a further narrower range with one power MOSFET 100 in a wide main current range. Although sensing resistance 72 is 100Ω in the example described above, sensing resistance 72 may be selected appropriately to optimize the voltage fed to detector circuit 73 considering the detector circuit 73 characteristics.

If the sensing ratio is set to be 10000/11=909 by connecting two sensing MOSFET's 62 and 63 in parallel, a power MOSFET exhibiting three steps of sensing ratios (909, 1000, and 10000) is obtained.

In FIG. 3, the sensing currents $I_S1$ and $I_S2$ are made to flow to ground 76 through sensing resistance 72. Alternatively, sensing resistance 72 is connected not to ground 76 but to load 71, and the sensing currents $I_S1$ and $I_S2$ which flow out from sensing resistance 72 are made to flow to ground 76 through load 71. It is effective to select any of the connections before the use thereof.

Second Embodiment

Figure 7:
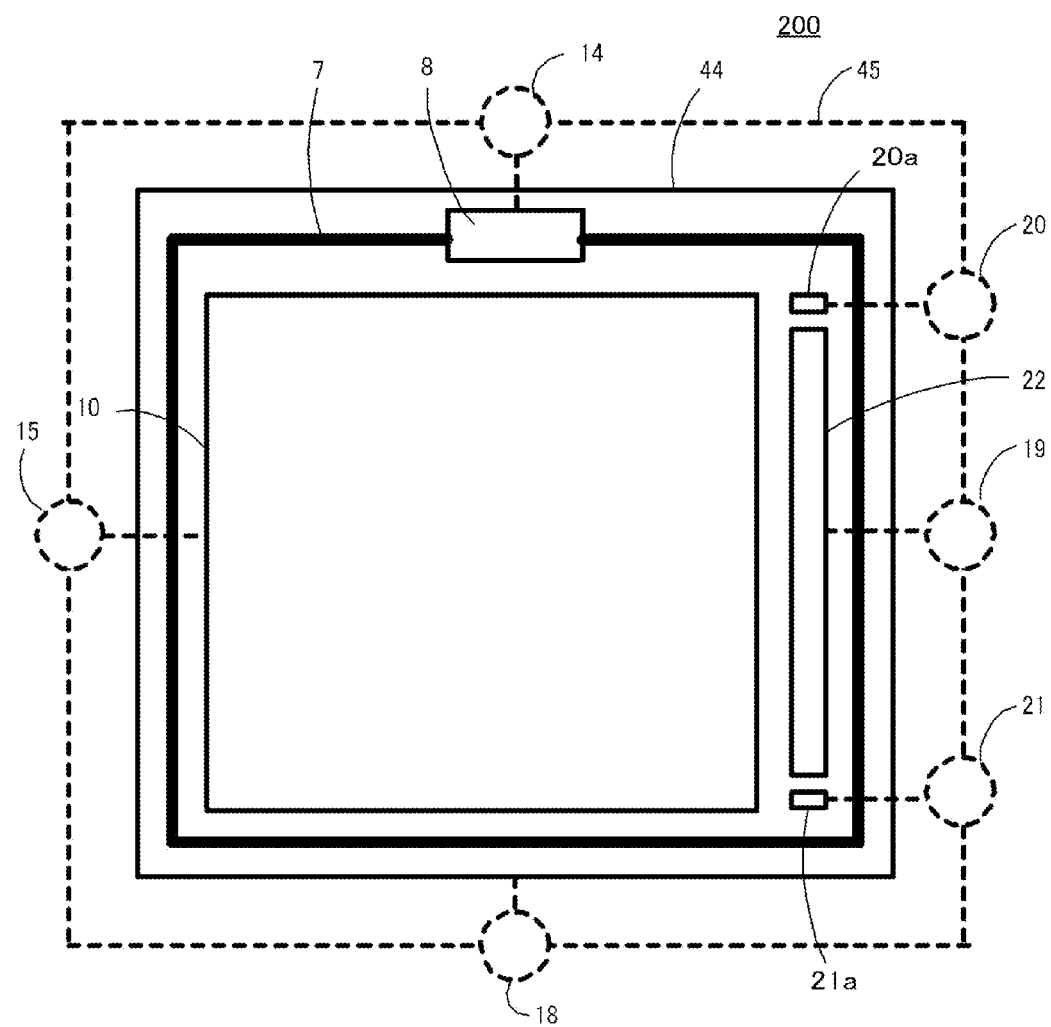
FIG. 7 is the top plan view of a semiconductor apparatus according to a second embodiment of the invention.
Figure 8:
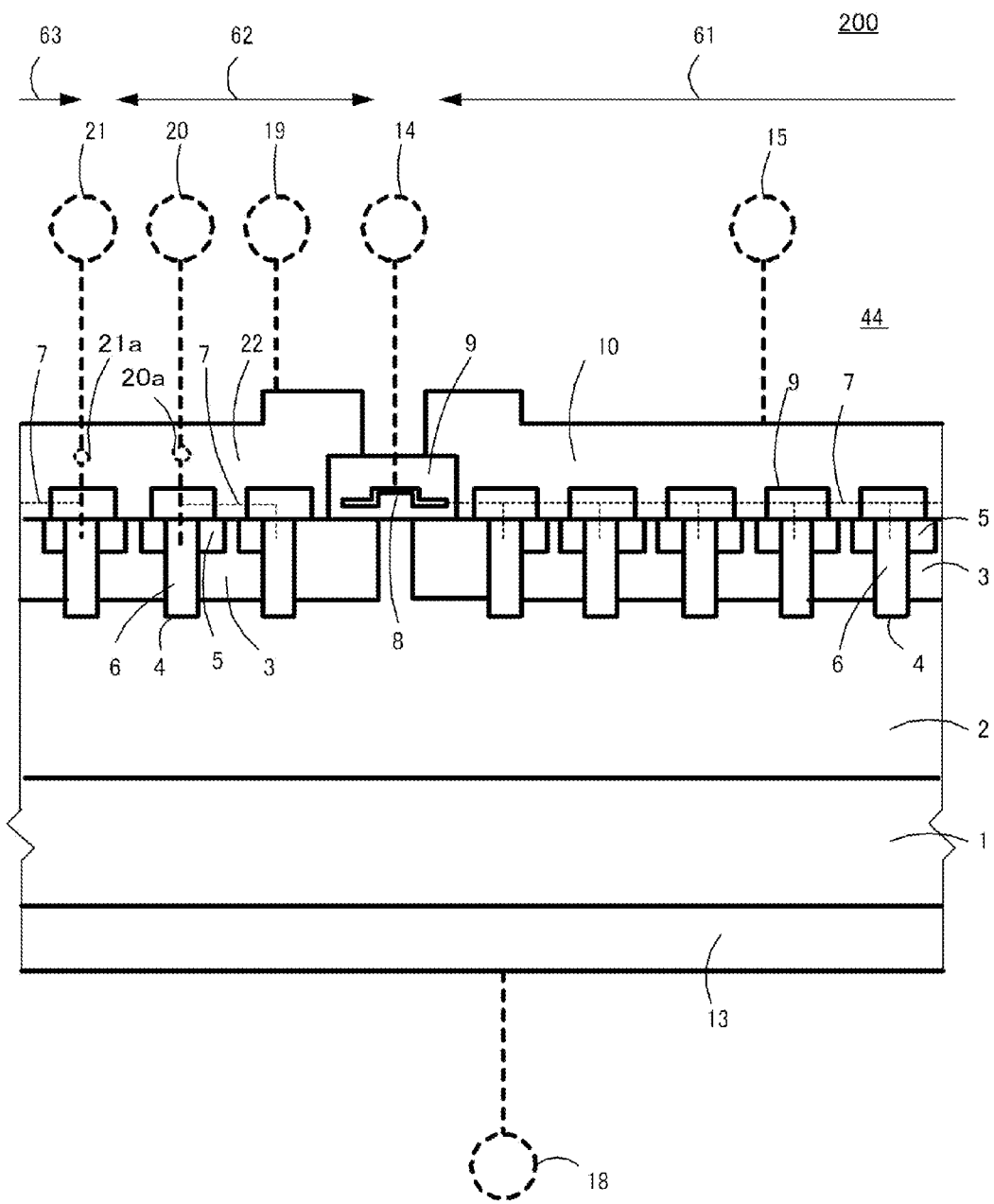
FIG. 8 is the cross sectional view of the semiconductor apparatus according to the second embodiment.
Figure 9:
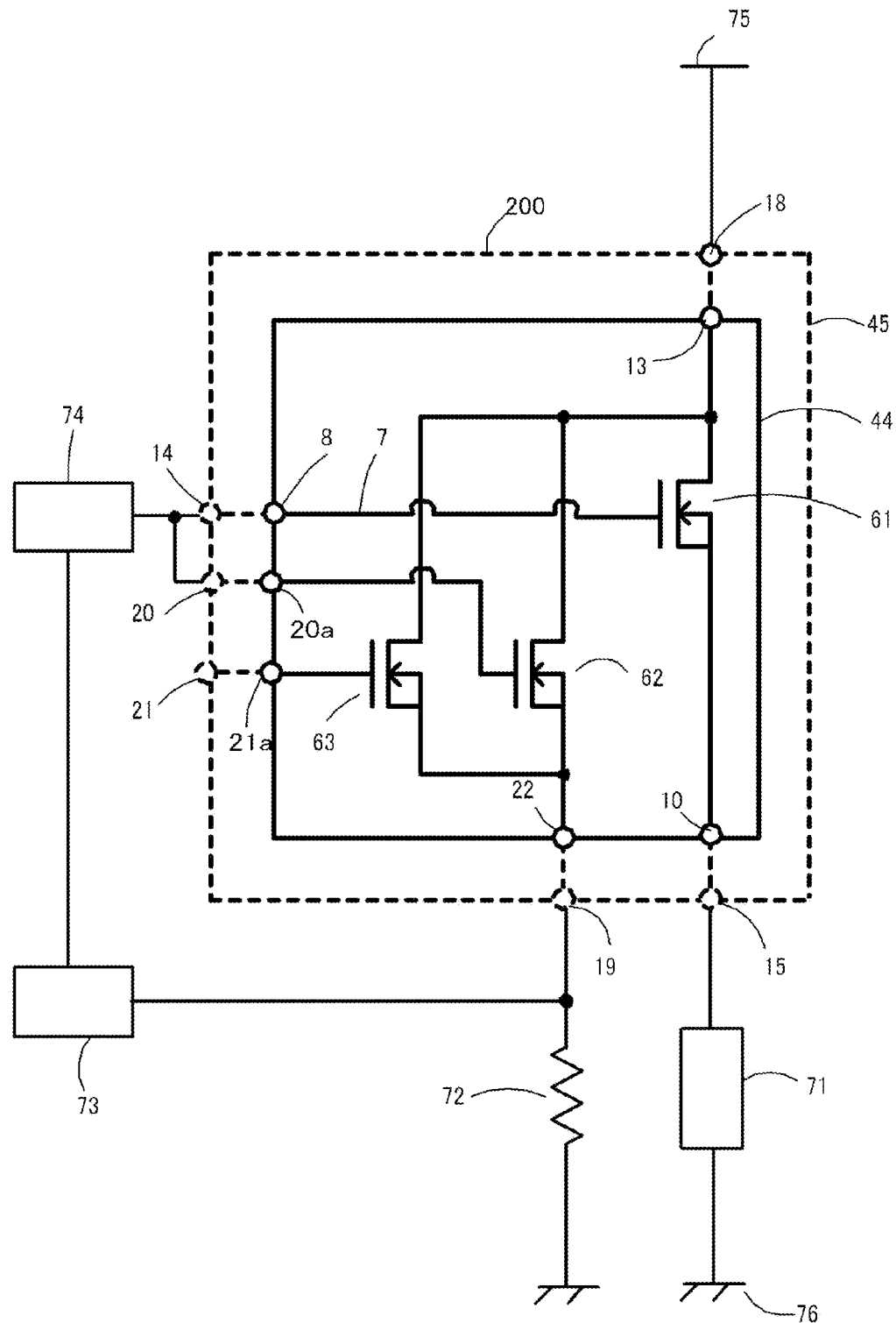
FIG. 9 is an equivalent circuit diagram of power MOSFET 200 in FIGS. 7 and 8.

FIG. 7 is the top plan view of a semiconductor apparatus according to a second embodiment of the invention. FIG. 8 is the cross sectional view of the semiconductor apparatus according to the second embodiment. The semiconductor apparatus according to the second embodiment is power MOSFET 200 including sensing MOSFET's. FIG. 9 is an equivalent circuit diagram of power MOSFET 200 in FIGS. 7 and 8. The circuits connected to the outside of power MOSFET 200 are also shown in FIG. 9.

The semiconductor apparatus according to the second embodiment is different from the semiconductor apparatus according to the first embodiment in that first source electrode 11 in first sensing MOSFET 62 and second source electrode 12 in second sensing MOSFET 63 are replaced by common source electrode 22. The semiconductor apparatus according to the second embodiment is different from the semiconductor apparatus according to the first embodiment also in that the gate electrode pad for first sensing MOSFET 62 and second sensing MOSFET 63 is divided into first gate electrode pad 20a and second gate electrode pad 21a, which are spaced apart from main gate electrode pad 8 on chip 44. When the main current of main MOSFET 61 is in the range between 10 A and 100 A, first sensing MOSFET 62 is used. When the main current of main MOSFET 61 is in the range between 1 A and 10 A, second sensing MOSFET 63 is used. In this example, the effects the same with the effects which the semiconductor apparatus according to the first embodiment exhibits are obtained.

Power MOSFET 200 according to the second embodiment includes six terminals including three gate terminals, two source terminals, and one drain terminal.

In FIG. 7 through 9, common source terminal 19, first gate terminal 20 of first sensing MOSFET 62, first gate electrode pad 20a on first sensing MOSFET 62, second gate terminal 21 of second sensing MOSFET 63, second gate electrode pad 21a on second sensing MOSFET 63, common source electrode 22, chip 44, and casing 45 are shown.

In the semiconductor apparatus according to the second embodiment, it is preferable to provide casing 45 with terminals 14, 18, 15, 19, 20, and 21 corresponding to electrode pads 8, 13, 10, 22, 20a, and 21a on chip 44. In this example, the sensing ratio may be selected after chip 44 is housed (sealed) in casing 45.

Alternatively, it is preferable to provide chip 44 with terminals 14, 18, 15, and 19 corresponding to electrode pads 8, 13, 10, and 22 and to provide chip 44 with terminal 20 corresponding to electrode pads 20a and 21a. In this example, the sensing ratio may be selected in housing chip 44 in casing 45 and the number of the terminals may be reduced.

Third Embodiment

Figure 10:
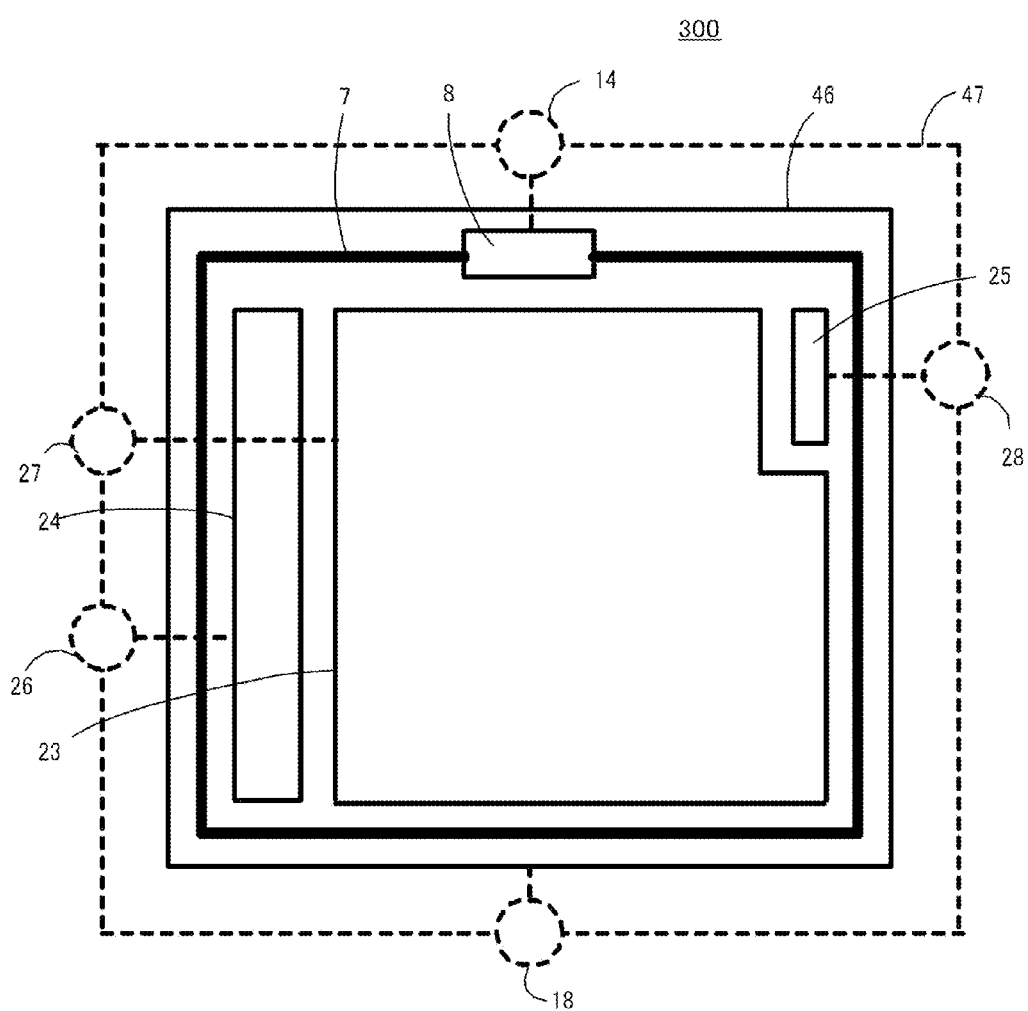
FIG. 10 is the top plan view of a semiconductor apparatus according to a third embodiment of the invention.
Figure 11:
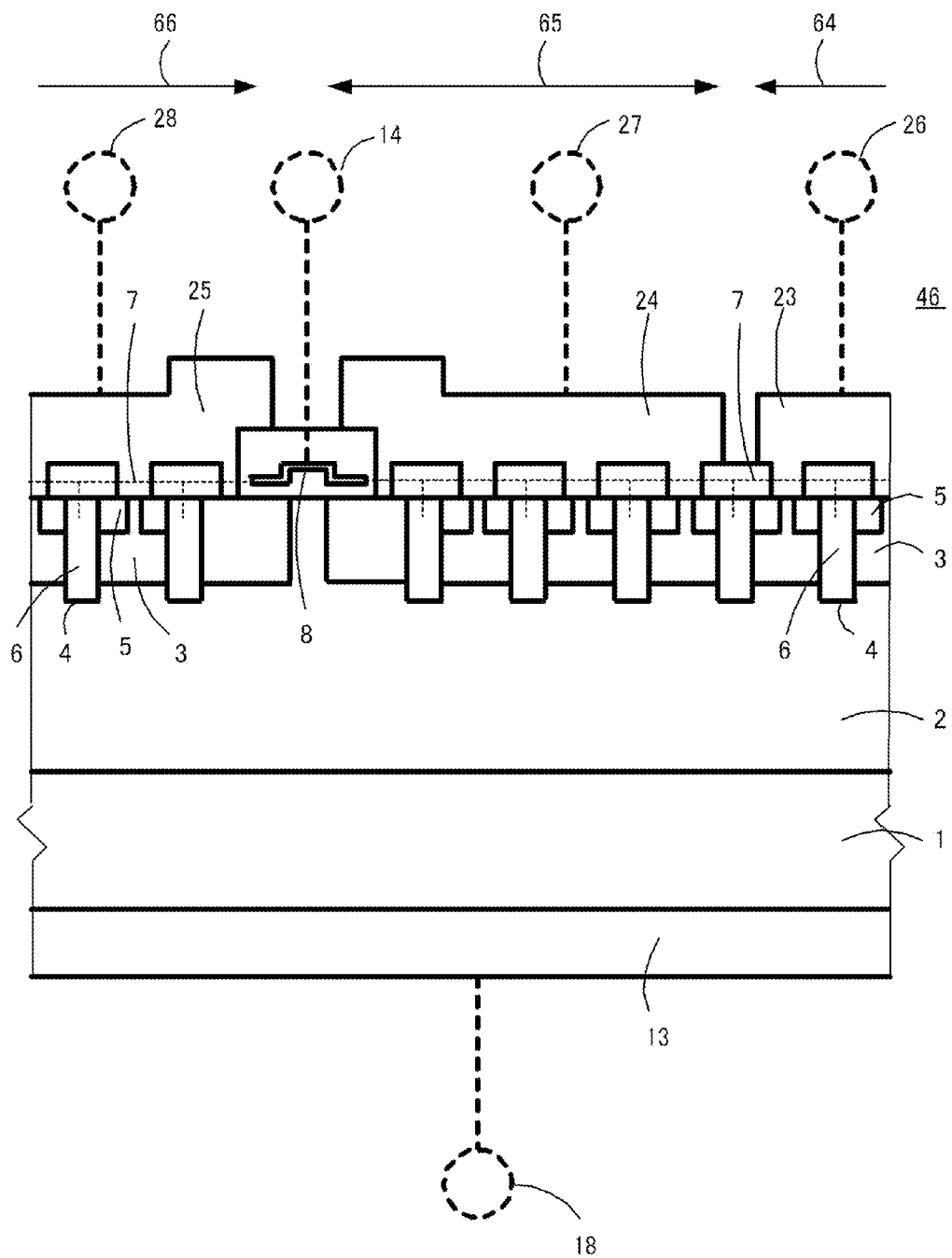
FIG. 11 is the cross sectional view of the semiconductor apparatus according to the third embodiment.
Figure 12:
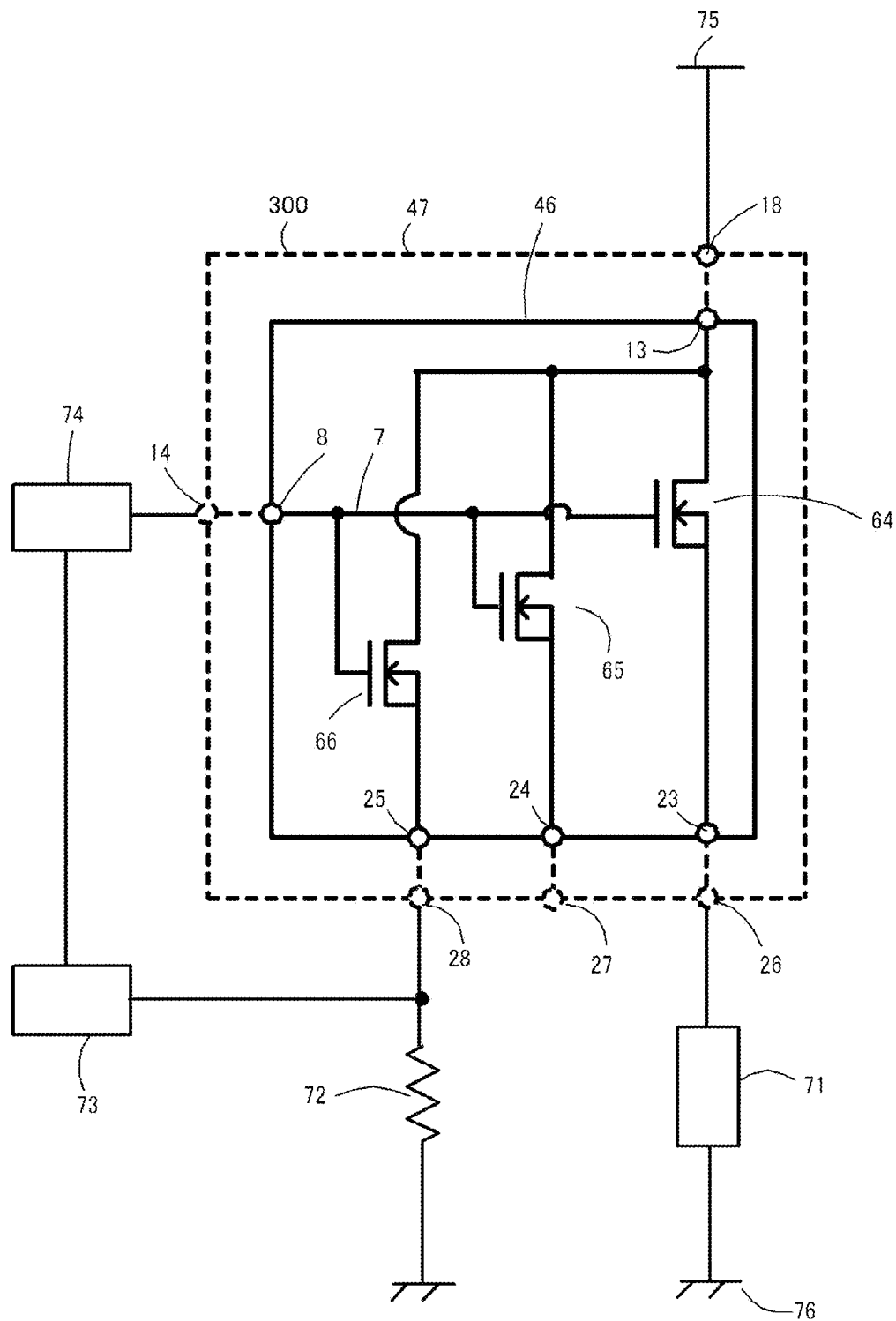
FIG. 12 is an equivalent circuit diagram of power MOSFET 300 in FIGS. 10 and 11.

FIG. 10 is the top plan view of a semiconductor apparatus according to a third embodiment of the invention. FIG. 11 is the cross sectional view of the semiconductor apparatus according to the third embodiment. The semiconductor apparatus according to the third embodiment is power MOSFET 300 including a sensing MOSFET. FIG. 12 is an equivalent circuit diagram of power MOSFET 300 in FIGS. 10 and 11. The circuits connected to the outside of power MOSFET 300 are also shown in FIG. 12.

Power MOSFET 300 according to the third embodiment is different from power MOSFET 100 according to the first embodiment in that power MOSFET 300 includes two main MOSFET's 64 and 65 and one sensing MOSFET 66. In this example, the current range of first main MOSFET 64 is from 10 A to 100 A and the current range of second main MOSFET 65 is from 1 A to 10 A. When sensing MOSFET 66 is used in combination with first main MOSFET 64, the total area of $n^+$ source region 5 in first main MOSFET 64 is set to be 10000 times as wide as the total area of $n^+$ source region 5 in sensing MOSFET 66. Then, the sensing ratio design value is 10000.

When sensing MOSFET 66 is used in combination with second main MOSFET 65, the total area of $n^+$ source region 5 in second main MOSFET 65 is set to be 1000 times as wide as the total area of $n^+$ source region 5 in sensing MOSFET 66. Then, the sensing ratio design value is 1000.

Therefore, the semiconductor apparatus according to the third embodiment is power MOSFET 300 that includes five terminals including one gate terminal, three source terminals, and one drain terminal.

Due to the structure described above, the current $I_S$ that flows through sensing MOSFET 66 falls in the range between 0.001 A and 0.01 A. If sensing resistance 72 is set to be 100Ω, the voltage drop caused across sensing resistance 72 will be from 0.1 V to 1 V. By feeding the voltage drop caused across sensing resistance 72 to a detector circuit, the current that flows to the load is measured very precisely in a wide range.

In FIG. 10 through 12, first source electrode 23 in first main MOSFET 64, second source electrode 24 in second main MOSFET 65, source electrode 25 in sensing MOSFET 66, first source terminal 26 of first main MOSFET 64, second source terminal 27 of second main MOSFET 65, source terminal 28 of sensing MOSFET 66, chip 46, and casing 47 are shown.

In the same manner as according to the first and second embodiments, terminals 26 and 27 for setting the sensing ratio are disposed on casing 47 corresponding to electrode pads 23 and 24 so that the sensing ratio may be selected after chip 46 is housed in casing 47. Alternatively, the sensing ratio is selected in housing chip 46 in casing 47 and electrode pad 23 or 24 or electrode pads 23 and 24 are connected, for example, to terminal 26 so that terminal 27 may be omitted.

Fourth Embodiment

Figure 13:
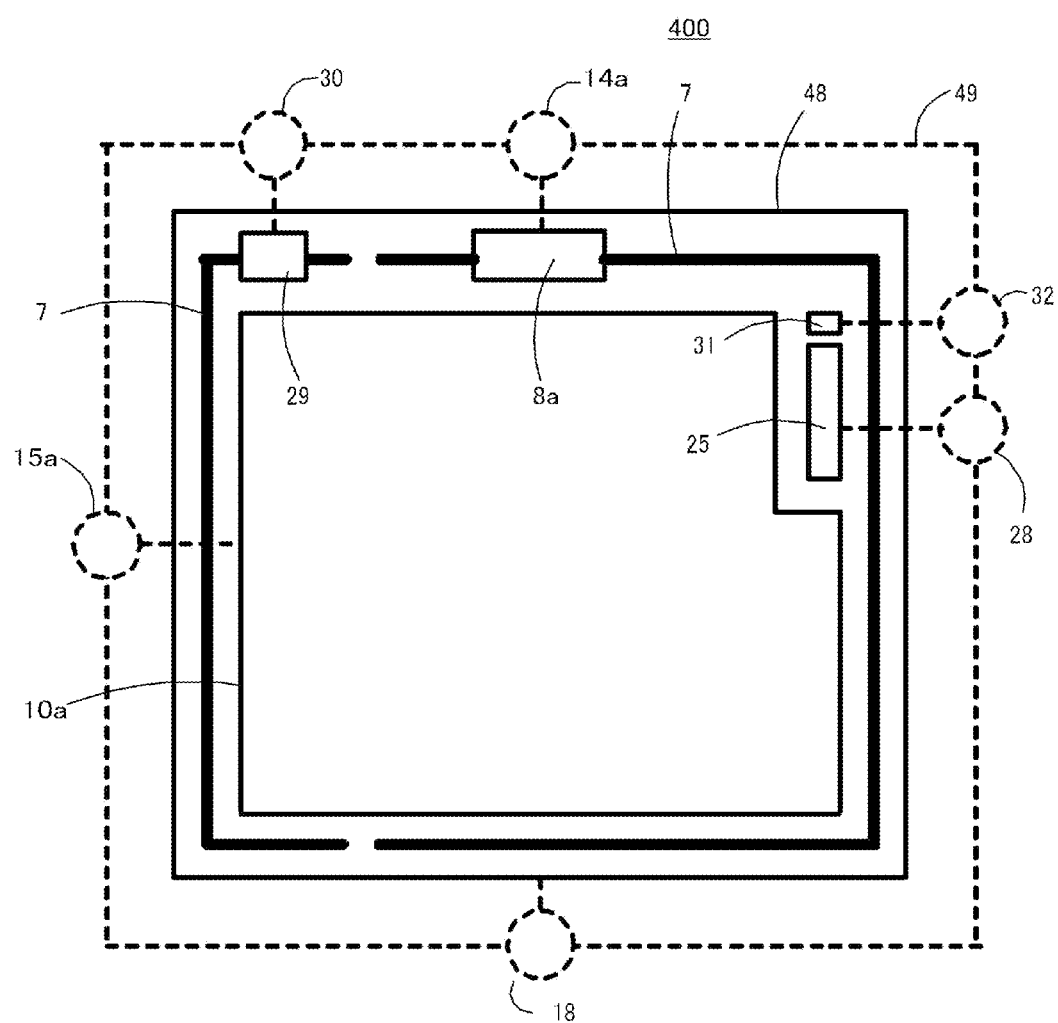
FIG. 13 is the top plan view of a semiconductor apparatus according to a fourth embodiment of the invention.
Figure 14:
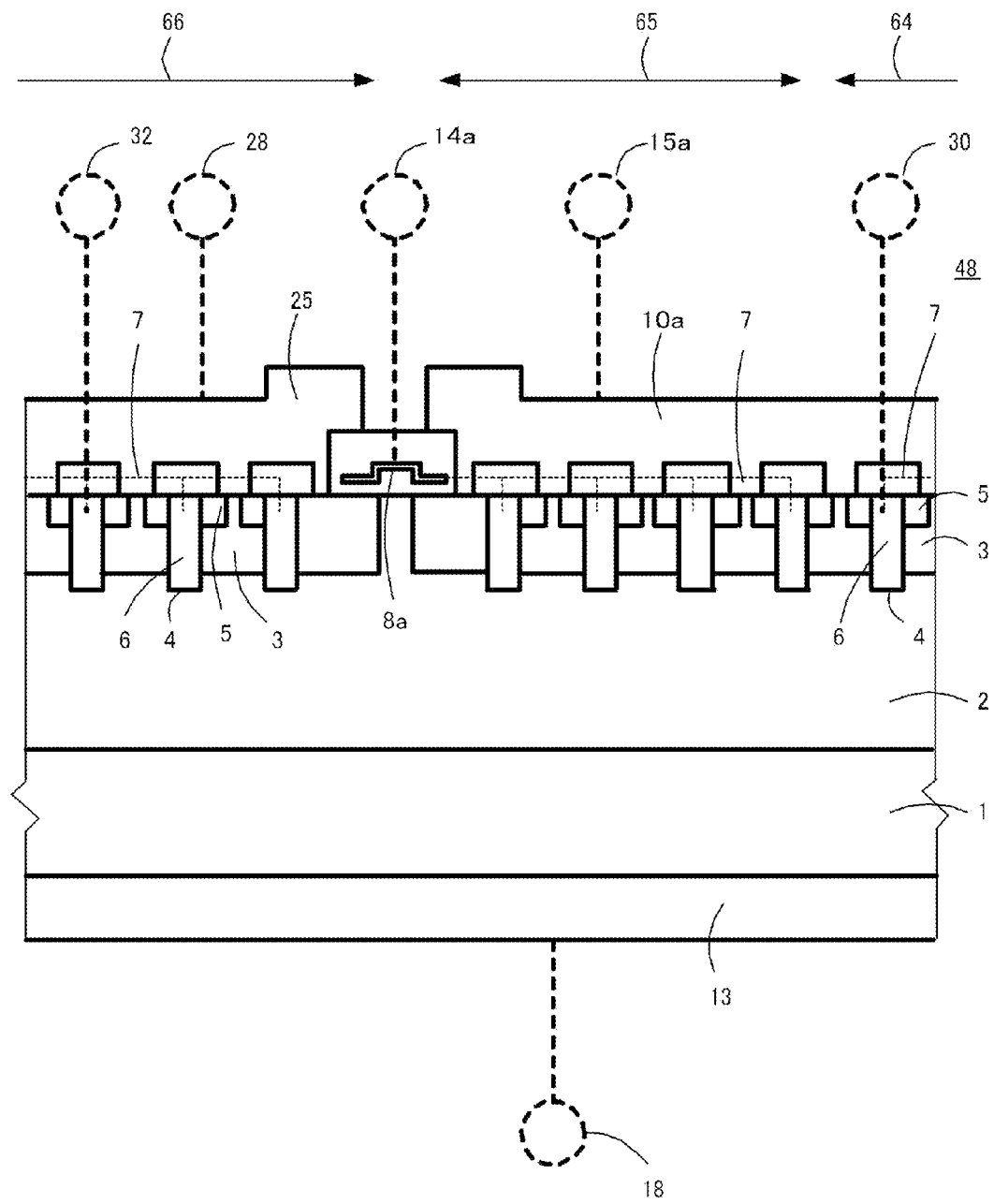
FIG. 14 is the cross sectional view of the semiconductor apparatus according to the fourth embodiment.
Figure 15:
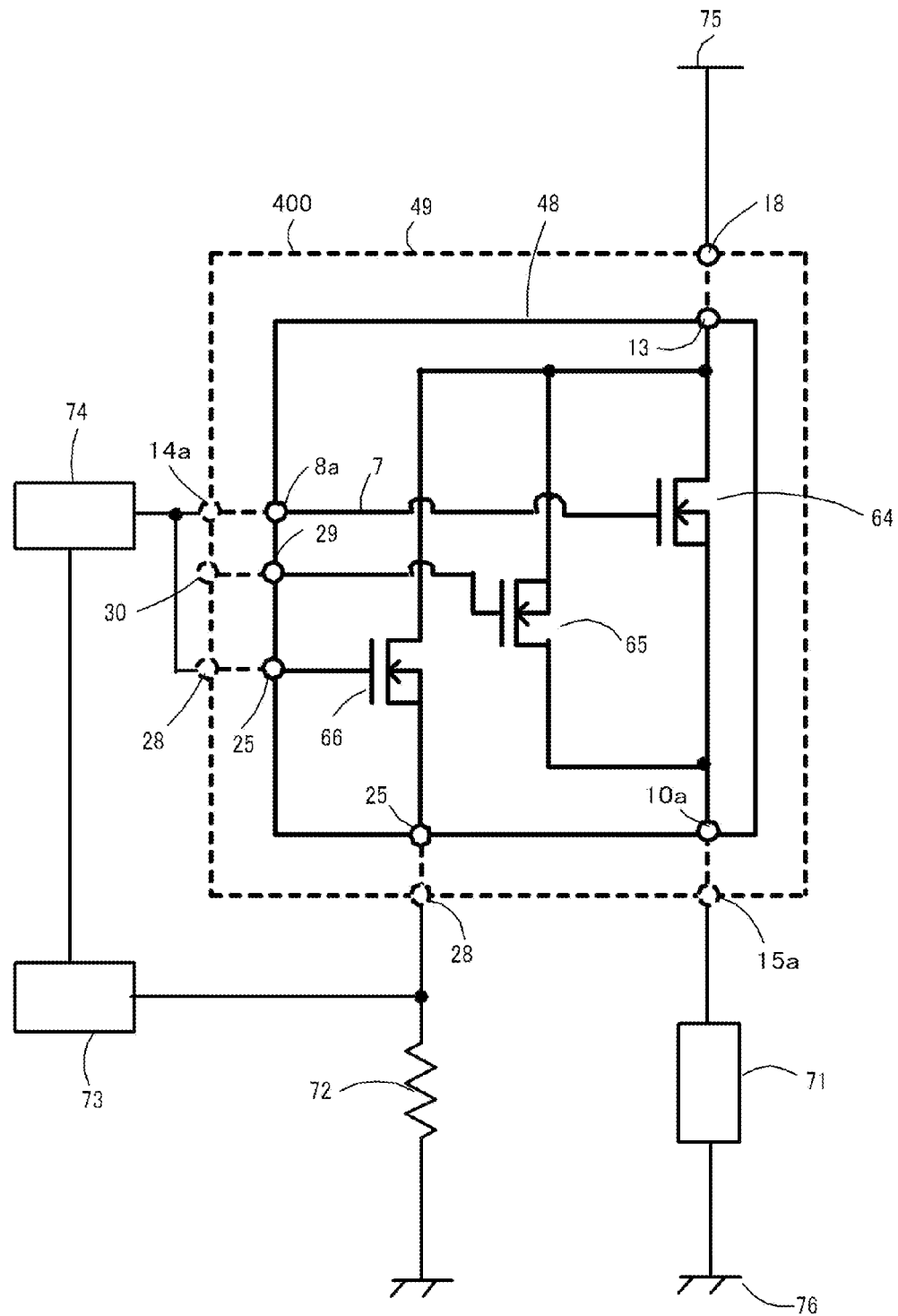
FIG. 15 is an equivalent circuit diagram of power MOSFET 400 in FIGS. 13 and 14.

FIG. 13 is the top plan view of a semiconductor apparatus according to a fourth embodiment of the invention. FIG. 14 is the cross sectional view of the semiconductor apparatus according to the fourth embodiment. The semiconductor apparatus according to the fourth embodiment is power MOSFET 400 including a sensing MOSFET. FIG. 15 is an equivalent circuit diagram of power MOSFET 400 in FIGS. 13 and 14. The circuits connected to the outside of power MOSFET 400 are also shown in FIG. 15.

Power MOSFET 400 according to the fourth embodiment is different from power MOSFET 300 according to the third embodiment in that power MOSFET 400 includes three gate terminals and two source terminals.

First source electrode 23 in first main MOSFET 64 and second source electrode 24 in first main MOSFET 65 shown in FIGS. 10 and 11 are connected to each other on chip 48 to be common source electrode 10a in FIGS. 13 and 14.

In combining first main MOSFET 64 with sensing MOSFET 66, first gate terminal 14a, to which first gate electrode 6 in first main MOSFET 64 is connected via first gate electrode pad 8a, and sensing gate terminal 28, to which sensing gate electrode 6 in sensing MOSFET 66 is connected via sensing gate electrode pad 25, are connected to each other. Then, first gate terminal 14a and sensing gate terminal 28 are connected to control circuit 74 via detector circuit 73 in the outside.

In combining second main MOSFET 65 with sensing MOSFET 66, second gate terminal 30, to which second gate electrode 6 in second main MOSFET 65 is connected via second gate electrode pad 29, and sensing gate terminal 28, to which sensing gate electrode 6 in sensing MOSFET 66 is connected via sensing gate electrode pad 25, are connected to each other. Then, second gate terminal 30 and sensing gate terminal 28 are connected to control circuit 74 via detector circuit 73 in the outside.

Therefore, the semiconductor apparatus according to the fourth embodiment is power MOSFET 400 that includes six terminals including three gate terminals, two source terminals, and one drain terminal.

Power MOSFET 400 is used in the same manner as power MOSFET 300 according to the third embodiment. Power MOSFET 400 exhibits the effects the same with the effects, which power MOSFET 300 according to the third embodiment exhibits.

In FIG. 13 through 15, first gate electrode pad 8a on first main MOSFET 64, first gate terminal 14a of first main MOSFET 64, second gate electrode pad 29 on second main MOSFET 65, second gate terminal 30 of second main MOSFET 65, chip 48 and casing 49 are shown.

In the same manner as according to the first through third embodiments, terminals 14a and 30 for setting the sensing ratio are disposed on casing 49 corresponding to electrode pads 8a and 29 so that the sensing ratio may be selected after chip 48 is housed in casing 49. Alternatively, the sensing ratio is selected in housing chip 48 in casing 49 and electrode pad 8a or 29 or electrode pads 8a and 29 are connected, for example, to terminal 14a so that terminal 30 may be omitted.

Fifth Embodiment

Figure 16:
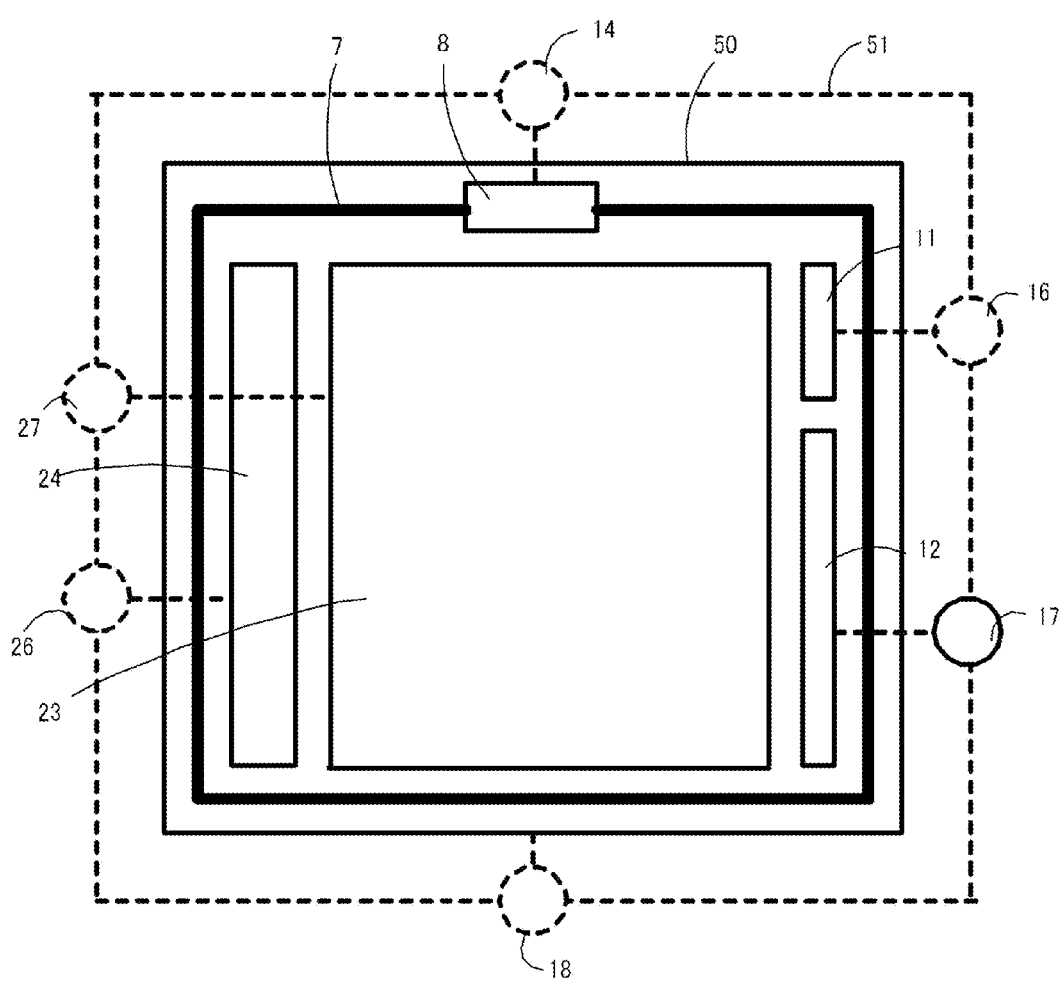
FIG. 16 is the top plan view of a semiconductor apparatus according to a fifth embodiment of the invention.
Figure 17:
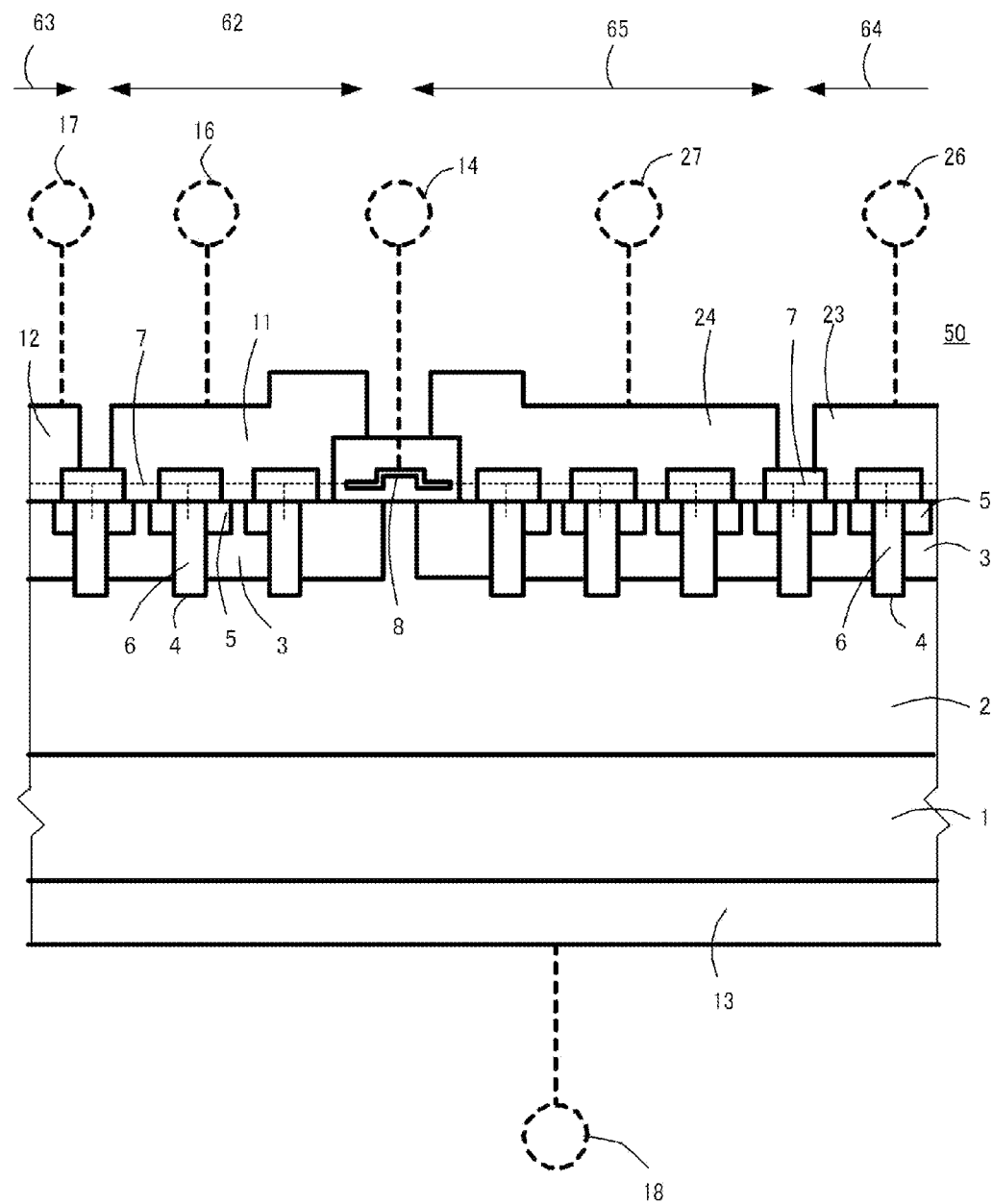
FIG. 17 is the cross sectional view of the semiconductor apparatus according to the fifth embodiment.
Figure 18:
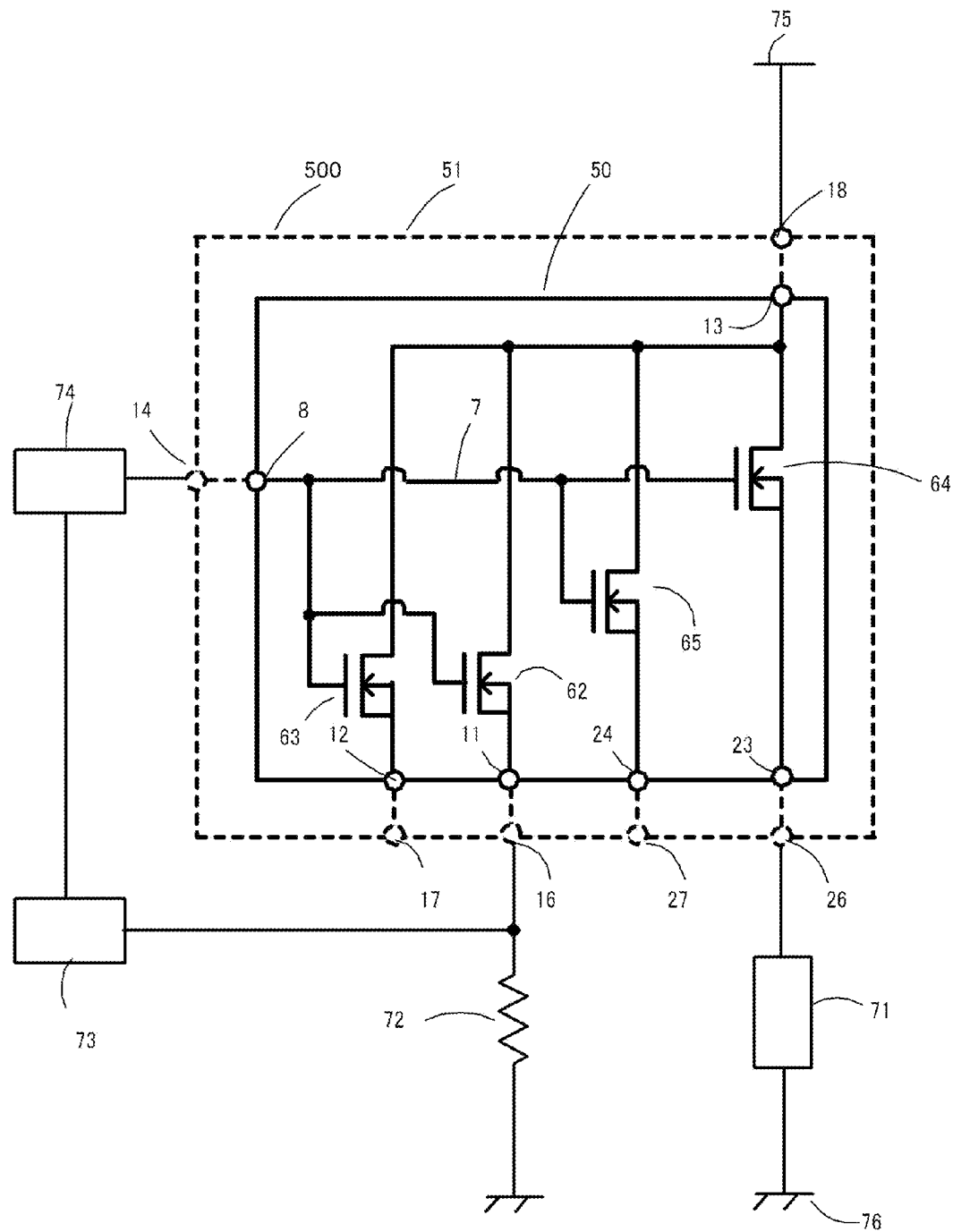
FIG. 18 is an equivalent circuit diagram of power MOSFET 500 in FIGS. 16 and 17.

FIG. 16 is the top plan view of a semiconductor apparatus according to a fifth embodiment of the invention. FIG. 17 is the cross sectional view of the semiconductor apparatus according to the fifth embodiment. The semiconductor apparatus according to the fifth embodiment is power MOSFET 500 including sensing MOSFET's. FIG. 18 is an equivalent circuit diagram of power MOSFET 500 in FIGS. 16 and 17. The circuits connected to the outside of power MOSFET 500 are also shown in FIG. 18.

Power MOSFET 500 according to the fifth embodiment is different from power MOSFET 100 according to the first embodiment in that power MOSFET 500 included two main MOSFET's 64 and 65. The current range of first main MOSFET 64 is set to be from 10 A to 100 A. The current range of second main MOSFET 65 is set to be from 1 A to 10 A. If the total area of $n^+$ source layer 5 in first main MOSFET 64 is set to be 10000 times as wide as the total area of $n^+$ source layer 5 in first sensing MOSFET 62 in combining first main MOSFET 64 with first sensing MOSFET 62, the sensing ratio design value will be 10000.

If the total area of $n^+$ source layer 5 in second main MOSFET 65 is set to be 1000 times as wide as the total area of $n^+$ source layer 5 in second sensing MOSFET 63 in combining second main MOSFET 65 with second sensing MOSFET 63, the sensing ratio design value will be 1000.

Gate electrodes 6 in first and second main MOSFET's 64 and 65 and in first and second sensing MOSFET's 62 and 63 are connected to main gate terminal 14 via main gate electrode pad 8.

The semiconductor apparatus according to the fifth embodiment is power MOSFET 500 that includes six terminals including one gate terminal, four source terminals, and one drain terminal.

By combining main MOSFET's 64 and 65 with sensing MOSFET's 62 and 63, respectively, the sensing ratio variations are confined stably in a certain narrow range in a wide main current range.

In the same manner as according to the first through fourth embodiments, terminals 16 and 17 for setting the sensing ratio are disposed on casing 51 corresponding to electrode pads 11 and 12 and terminals 26 and 27 are disposed on casing 51 corresponding to electrode pads 23 and 24 so that the sensing ratios may be selected after chip 50 is housed in casing 51. Alternatively, the sensing ratios are selected in housing chip 50 in casing 51 and electrode pad 11 or 12 or electrode pads 11 and 12 are connected, for example, to terminal 16 so that terminal 17 may be omitted and electrode pad 23 or 24 or electrode pads 23 and 24 are connected, for example, to terminal 26 so that terminal 27 may be omitted.

Sixth Embodiment

Figure 19:
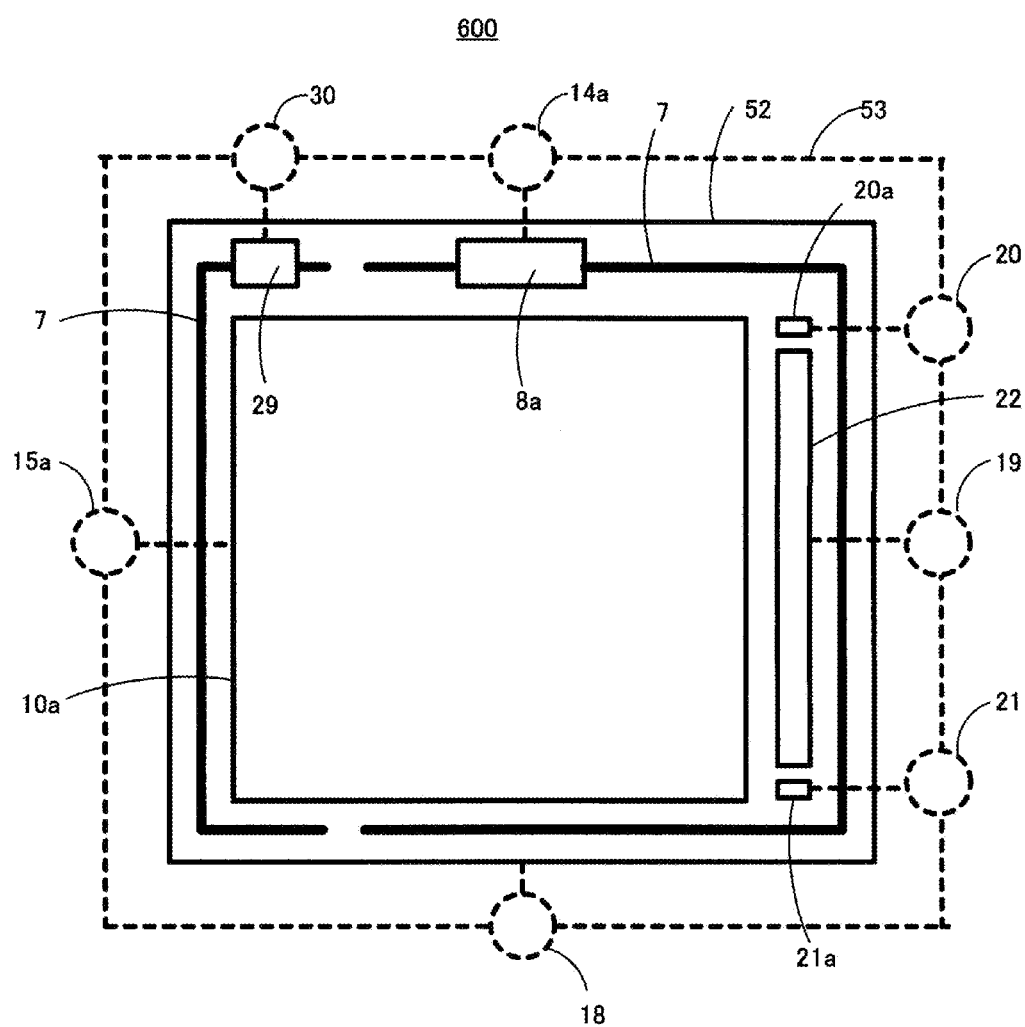
FIG. 19 is the top plan view of a semiconductor apparatus according to a sixth embodiment of the invention.
Figure 20:
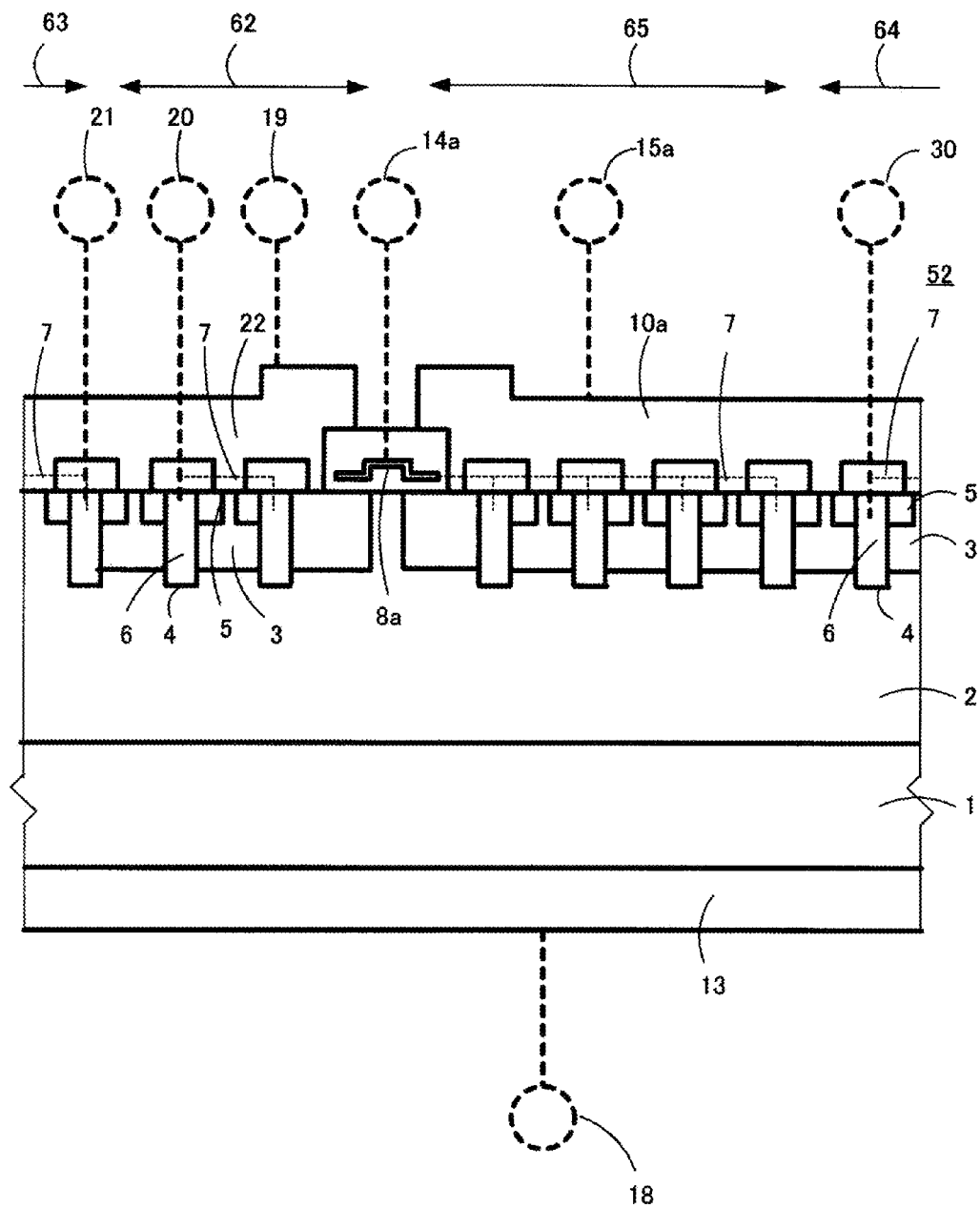
FIG. 20 is the cross sectional view of the semiconductor apparatus according to the sixth embodiment.
Figure 21:
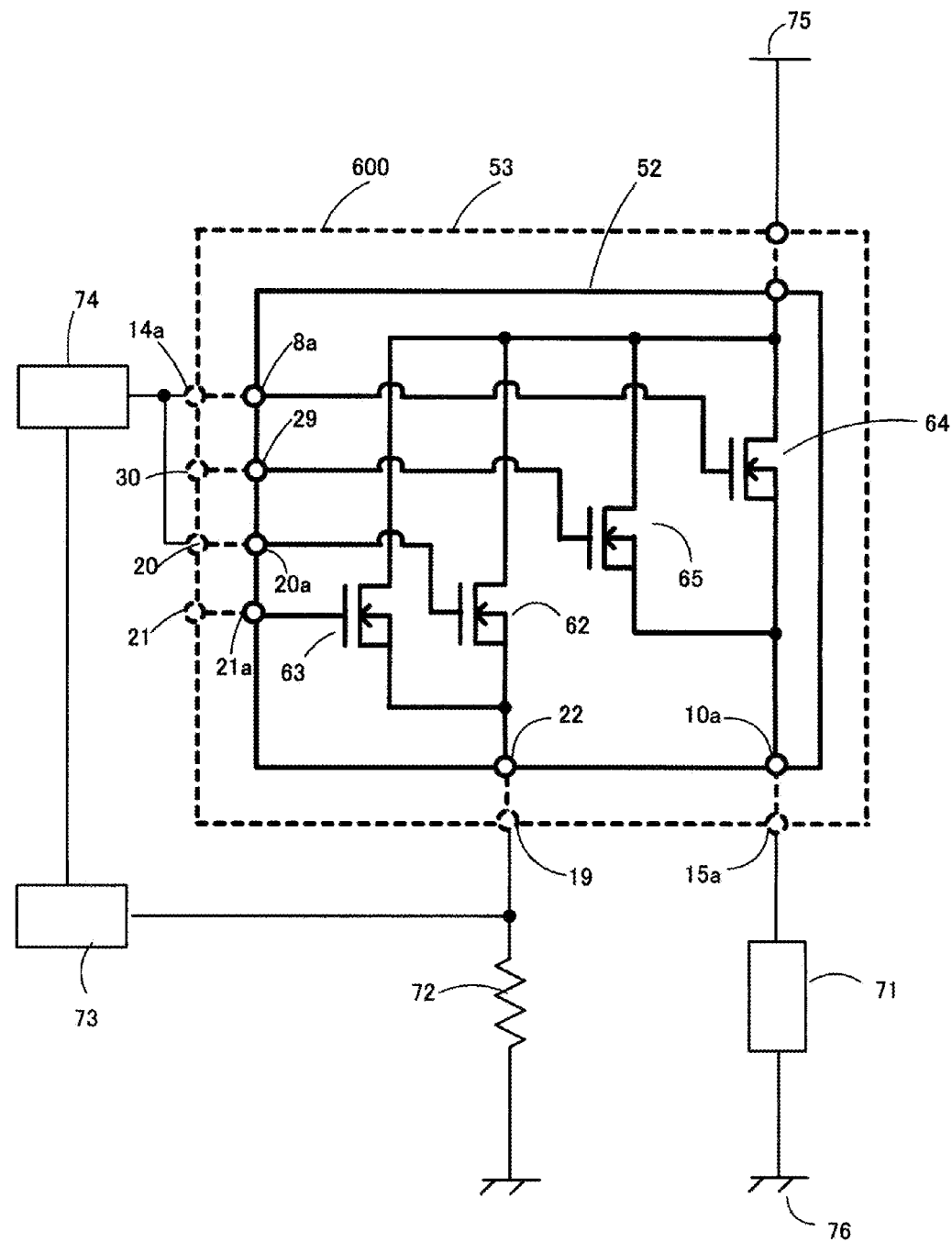
FIG. 21 is an equivalent circuit diagram of power MOSFET 600 in FIGS. 19 and 20.
Figure 22:
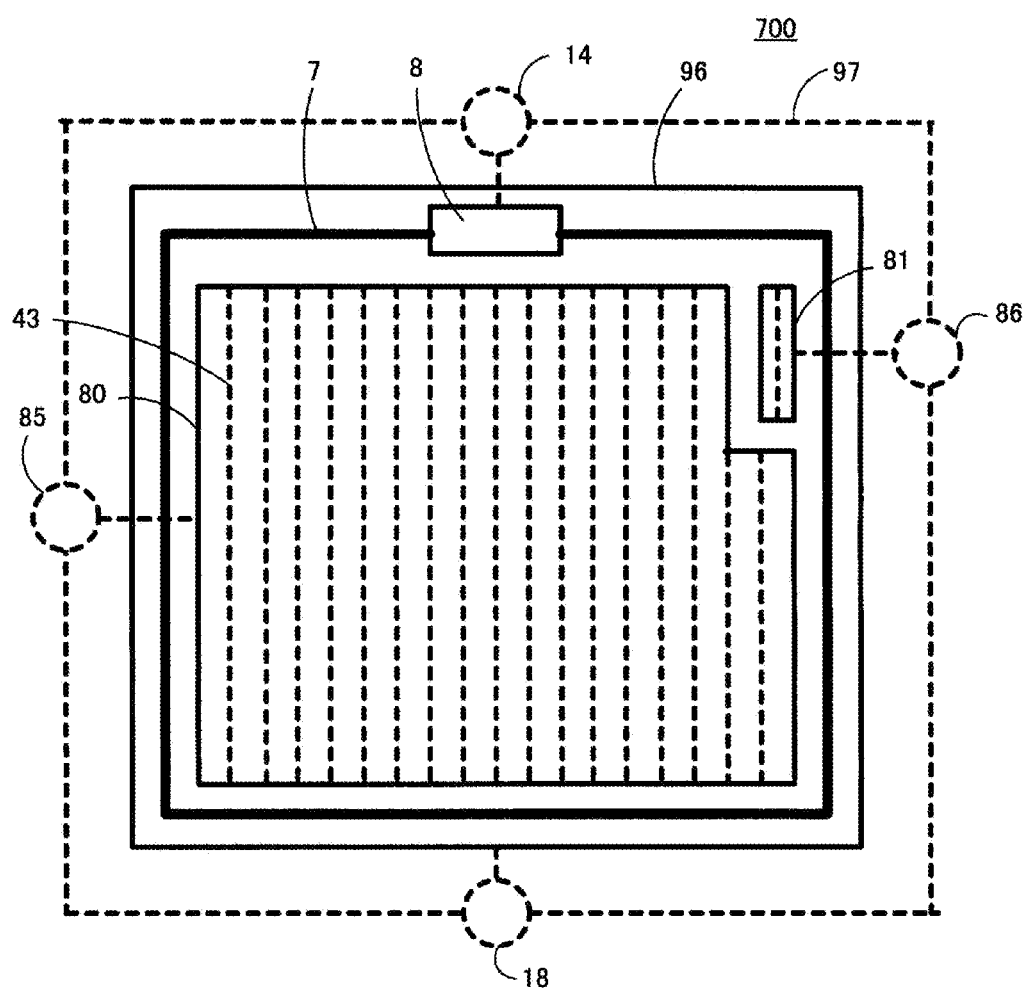
FIG. 22 is the top plan view of conventional power MOSFET 700 that includes a sensing MOSFET.
Figure 23:
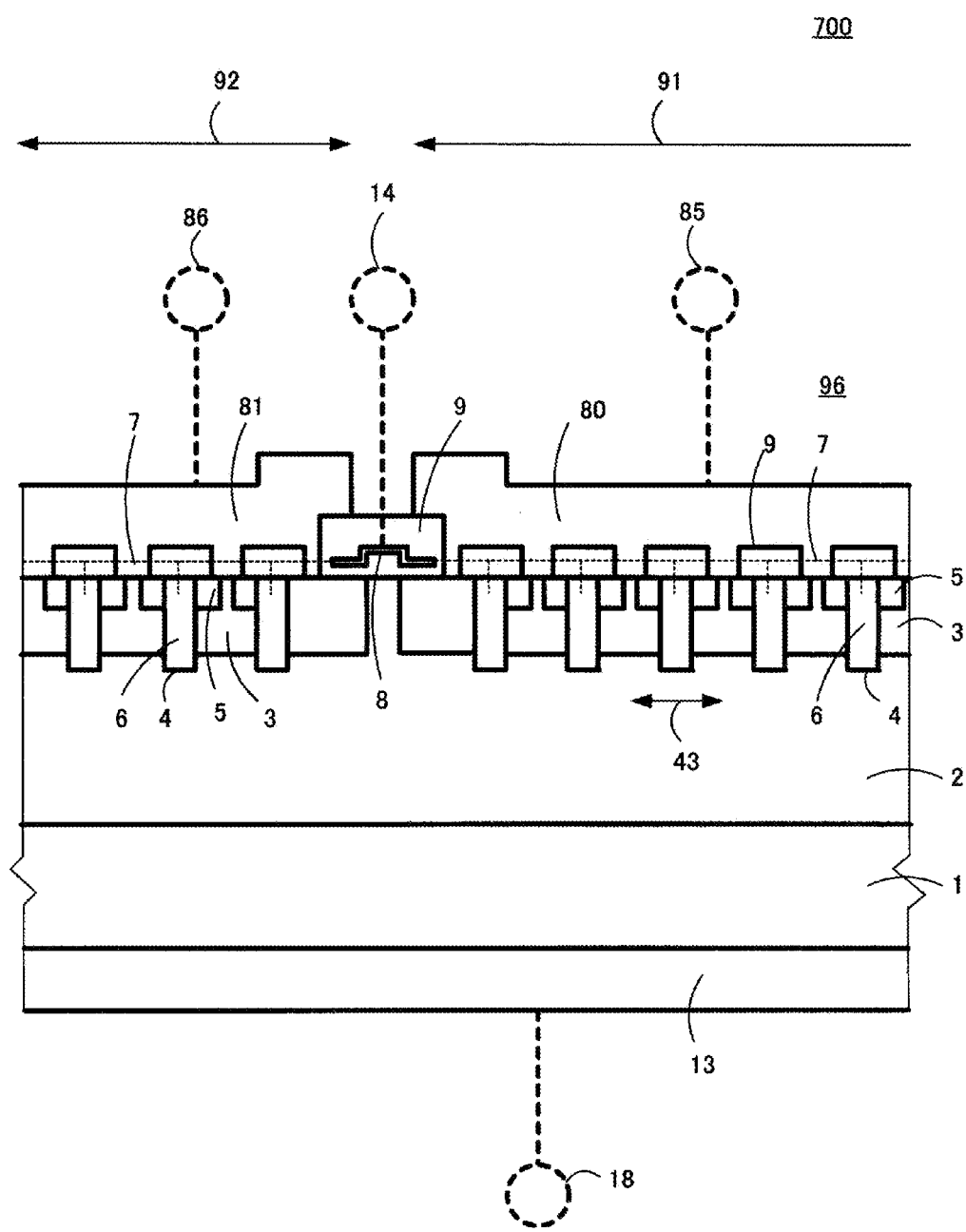
FIG. 23 is the cross sectional view of conventional power MOSFET 700.
Figure 24:
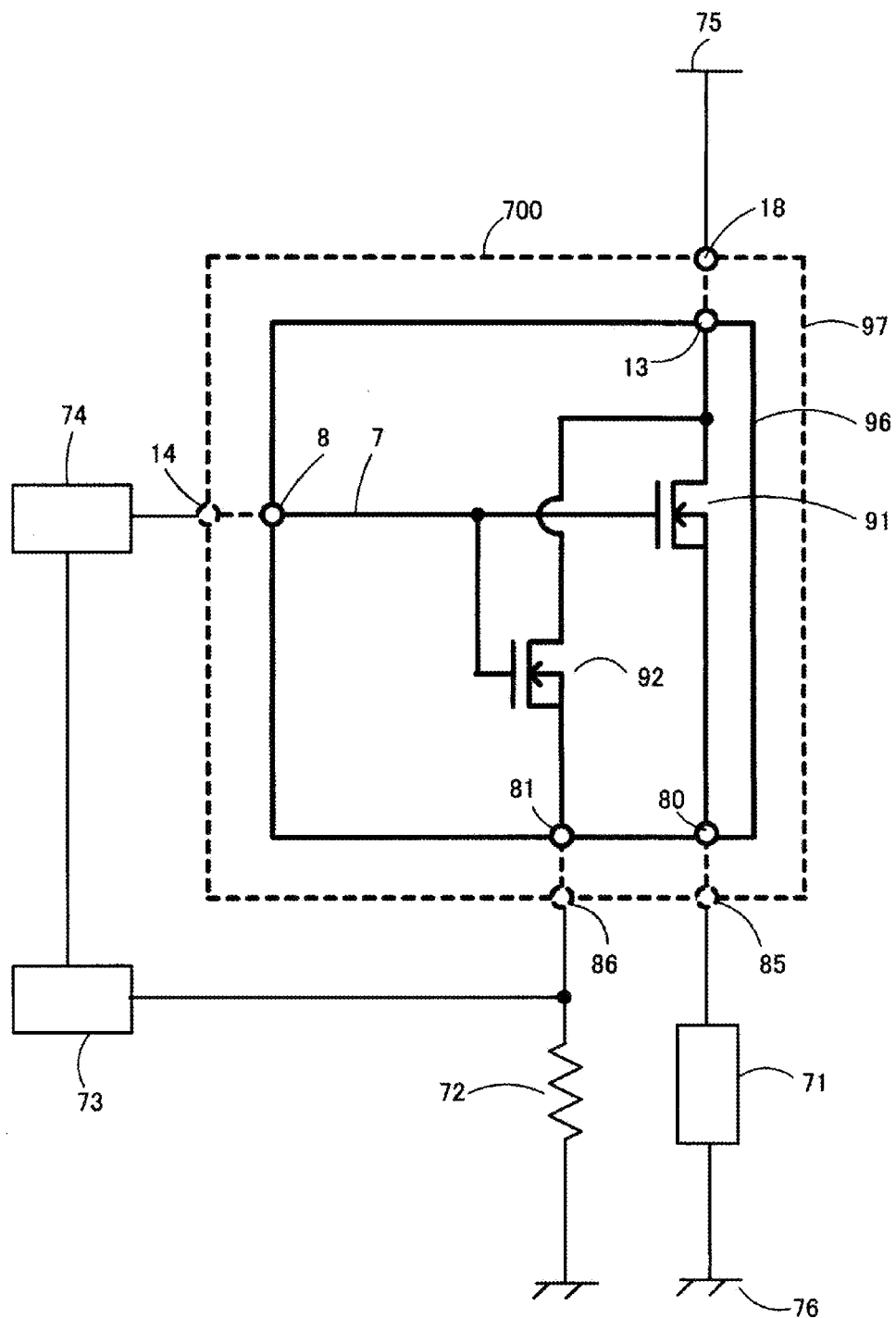
FIG. 24 is a circuit diagram of conventional power MOSFET 700 that includes a sensing MOSFET.
Figure 25:
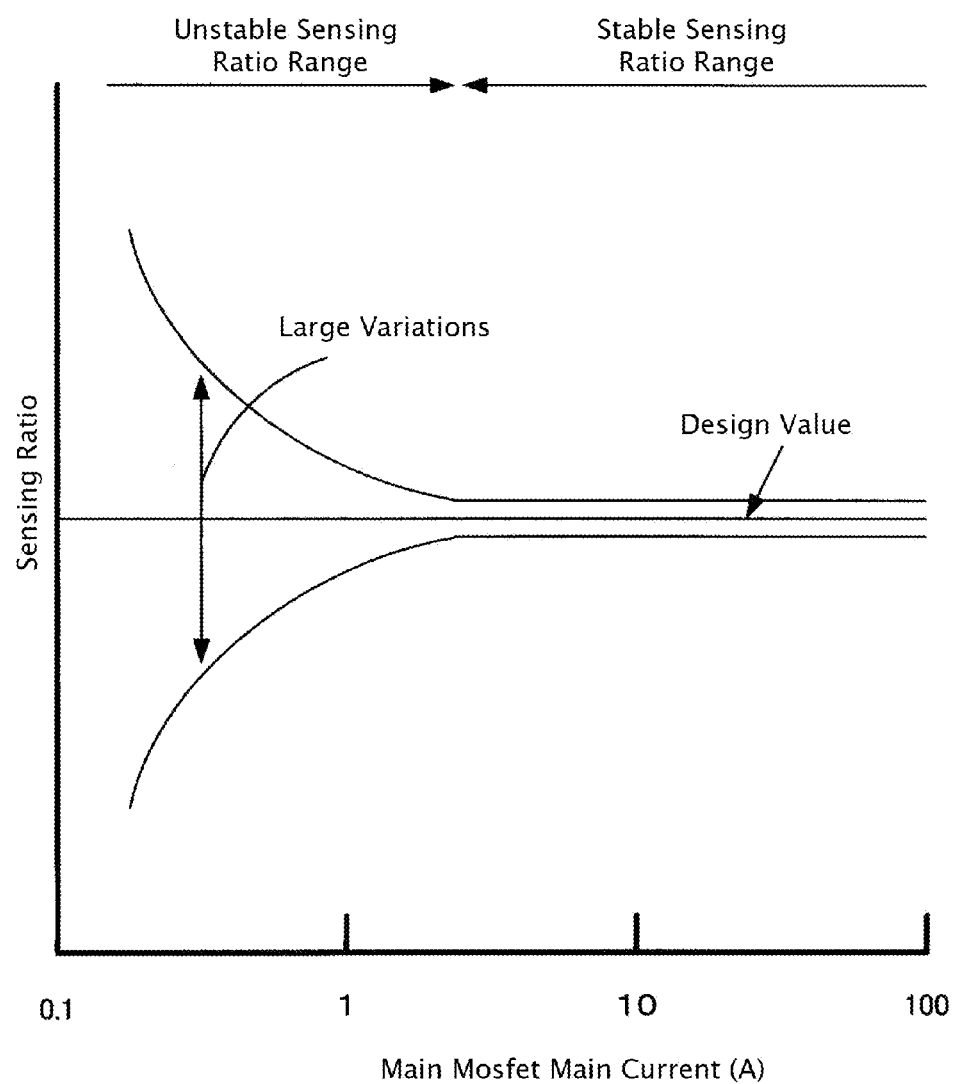
FIG. 25 illustrates the relation between the sensing ratio and the main current of the main MOSFET.

FIG. 19 is the top plan view of a semiconductor apparatus according to a sixth embodiment of the invention. FIG. 20 is the cross sectional view of the semiconductor apparatus according to the sixth embodiment. The semiconductor apparatus according to the sixth embodiment is power MOSFET 600 including sensing MOSFET's. FIG. 21 is an equivalent circuit diagram of power MOSFET 600 in FIGS. 19 and 20.

Power MOSFET 600 according to the sixth embodiment is different from power MOSFET 500 according to the fifth embodiment in that first gate electrode pad 20a on first sensing MOSFET 62 and second gate electrode pad 21a on second sensing MOSFET 63 are disposed separately. Power MOSFET 600 according to the sixth embodiment is different from power MOSFET 500 according to the fifth embodiment also in that first main MOSFET 64 and second main MOSFET 65 are provided with common source electrode 10a and first sensing MOSFET 62 and second sensing MOSFET 63 are provided with common source electrode 22.

The semiconductor apparatus according to the sixth embodiment is power MOSFET 600 that includes seven terminals including four gate terminals, two source terminals, and one drain terminal.

By combining main MOSFET's 64 and 65 with sensing MOSFET's 62 and 63, respectively, the sensing ratio variations are confined stably in a certain narrow range.

In the same manner as according to the first through fifth embodiments, terminals 14a and 30 for setting the sensing ratio are disposed on casing 53 corresponding to electrode pads 8a and 29 and terminals 20 and 21 are disposed on casing 51 corresponding to electrode pads 20a and 21a so that the sensing ratios may be selected after chip 52 is housed in casing 53. Alternatively, the sensing ratios are selected in housing chip 52 in casing 53 and electrode pad 8a or 29 or electrode pads 8a and 29 are connected, for example, to terminal 14a so that terminal 30 may be omitted and electrode pad 20a or 21a or electrode pads 20a and 21a are connected, for example, to terminal 20 so that terminal 21 may be omitted.

Although the semiconductor apparatuses according to the first through sixth embodiments have been described in connection with power MOSFET's which are power MOS transistors, the invention is applicable also to insulated gate bipolar transistors (IGBT's). Although the semiconductor apparatuses according to the first through sixth embodiments have a trench-gate structure, semiconductor apparatuses according to the invention may have a planar-gate structure.

This application is based on, and claims priority to, Japanese Patent Application No. 2010-033330, filed on Feb. 18, 2010. The disclosure of the priority application, in its entirety, including the drawings, claims, and the specification thereof, is incorporated herein by reference.

What is claimed is:

1. A semiconductor apparatus comprising:
   a semiconductor substrate;
   one or more main semiconductor devices on the semiconductor substrate, the main semiconductor devices making a main current flow;
   one or more main sensing semiconductor devices on the semiconductor substrate, the sensing semiconductor devices making a sensing current flow for measuring the main current; and
   a plurality of the main semiconductor devices exhibiting different current capacities or a plurality of the sensing semiconductor devices exhibiting different current capacities;
   wherein,
   a combination of a plurality of the main semiconductor devices and a sensing semiconductor device, a combination of a main semiconductor device and a plurality of the sensing semiconductor devices, or a combination of a plurality of the main semiconductor devices and a plurality of the sensing semiconductor devices is selected for setting a sensing ratio that is a ratio between the main current and the sensing current to be constant in a main current range used,
   wherein,
   at least one of the main semiconductor devices comprises a main MOS transistor comprising a main MOSFET;
   at least one of the sensing semiconductor devices comprises a sensing MOS transistor comprising a sensing MOSFET or a sensing IGBT; and
   a design value of the sensing ratio is determined by a ratio between a total area of a source layer or an emitter layer in the main MOS transistor and a total area of a source layer or an emitter layer in the sensing MOS transistor;
   the semiconductor apparatus further comprising:
   two pieces of the sensing MOS transistor, the current capacities thereof being different from each other;
   a gate electrode pad common to the main and sensing MOS transistors;
   a drain electrode or a collector electrode common to the main and sensing MOS transistor;
   a source electrode or an emitter electrode of the main MOS transistor;
   source electrodes or emitter electrodes of the two pieces of the sensing MOS transistor; and
   five terminals connected to the drain electrode or the collector electrode, the source electrodes or the emitter electrodes, and the gate electrode pad.

2. A semiconductor apparatus comprising:
   a semiconductor substrate;
   one or more main semiconductor devices on the semiconductor substrate, the main semiconductor devices making a main current flow;
   one or more main sensing semiconductor devices on the semiconductor substrate, the sensing semiconductor devices making a sensing current flow for measuring the main current; and
   a plurality of the main semiconductor devices exhibiting different current capacities or a plurality of the sensing semiconductor devices exhibiting different current capacities;
   wherein,
   a combination of a plurality of the main semiconductor devices and a sensing semiconductor device, a combination of a main semiconductor device and a plurality of the sensing semiconductor devices, or a combination of a plurality of the main semiconductor devices and a plurality of the sensing semiconductor devices is selected for setting a sensing ratio that is a ratio between the main current and the sensing current to be constant in a main current range used,
   wherein,
   at least one of the main semiconductor devices comprises a main MOS transistor comprising a main MOSFET;
   at least one of the sensing semiconductor devices comprises a sensing MOS transistor comprising a sensing MOSFET or a sensing IGBT, and
   a design value of the sensing ratio is determined by a ratio between a total area of a source layer or an emitter layer in the main MOS transistor and a total area of a source layer or an emitter layer in the sensing MOS transistor;
   the semiconductor apparatus further comprising:
   two pieces of the sensing MOS transistor, the current capacities thereof being different from each other;
   a gate electrode pad of the main MOS transistor;
   gate electrode pads of the two pieces of the sensing MOS transistor;

a drain electrode or a collector electrode common to the main and sensing MOS transistors;
a source electrode or an emitter electrode of the main MOS transistor;
a source electrode or an emitter electrode common to the two pieces of the sensing MOS transistor; and
six terminals connected to the drain electrode or the collector electrode, the source electrodes or the emitter electrodes, and the gate electrode pads.

3. A semiconductor apparatus comprising:
a semiconductor substrate;
one or more main semiconductor devices on the semiconductor substrate, the main semiconductor devices making a main current flow;
one or more main sensing semiconductor devices on the semiconductor substrate, the sensing semiconductor devices making a sensing current flow for measuring the main current; and
a plurality of the main semiconductor devices exhibiting different current capacities or a plurality of the sensing semiconductor devices exhibiting different current capacities;
wherein,
a combination of a plurality of the main semiconductor devices and a sensing semiconductor device, a combination of a main semiconductor device and a plurality of the sensing semiconductor devices, or a combination of a plurality of the main semiconductor devices and a plurality of the sensing semiconductor devices is selected for setting a sensing ratio that is a ratio between the main current and the sensing current to be constant in a main current range used,
wherein,
at least one of the main semiconductor devices comprises a main MOS transistor comprising a main MOSFET,
at least one of the sensing semiconductor devices comprises a sensing MOS transistor comprising a sensing MOSFET or a sensing IGBT, and
a design value of the sensing ratio is determined by a ratio between a total area of a source layer or an emitter layer in the main MOS transistor and a total area of a source layer or an emitter layer in the sensing MOS transistor;
the semiconductor apparatus further comprising:
two pieces of the main MOS transistor, the current capacities thereof being different from each other;
a gate electrode pad common to the main and sensing MOS transistors;
a drain electrode or a collector electrode common to the main and sensing MOS transistors;
source electrodes or emitter electrodes of the two pieces of the main MOS transistor;
a source electrode or an emitter electrode of the sensing MOS transistor; and
five terminals connected to the drain electrode or the collector electrode, the source electrodes or the emitter electrodes, and the gate electrode pad.

4. A semiconductor apparatus comprising:
a semiconductor substrate;
one or more main semiconductor devices on the semiconductor substrate, the main semiconductor devices making a main current flow;
one or more main sensing semiconductor devices on the semiconductor substrate, the sensing semiconductor devices making a sensing current flow for measuring the main current; and
a plurality of the main semiconductor devices exhibiting different current capacities or a plurality of the sensing semiconductor devices exhibiting different current capacities;
wherein,
a combination of a plurality of the main semiconductor devices and a sensing semiconductor device, a combination of a main semiconductor device and a plurality of the sensing semiconductor devices, or a combination of a plurality of the main semiconductor devices and a plurality of the sensing semiconductor devices is selected for setting a sensing ratio that is a ratio between the main current and the sensing current to be constant in a main current range used,
wherein,
at least one of the main semiconductor devices comprises a main MOS transistor comprising a main MOSFET,
at least one of the sensing semiconductor devices comprises a sensing MOS transistor comprising a sensing MOSFET or a sensing IGBT, and
a design value of the sensing ratio is determined by a ratio between a total area of a source layer or an emitter layer in the main MOS transistor and a total area of a source layer or an emitter layer in the sensing MOS transistor;
the semiconductor apparatus further comprising:
two pieces of the main MOS transistor, the current capacities thereof being different from each other;
gate electrode pads of the two pieces of the main MOS transistor;
a gate electrode pad of the sensing MOS transistor;
a drain electrode or a collector electrode common to the main and sensing MOS transistors;
a source electrode or an emitter electrode common to the two pieces of the main MOS transistor;
a source electrode or an emitter electrode of the sensing MOS transistor; and
six terminals connected to the drain electrode or the collector electrode, the source electrodes or the emitter electrodes, and the gate electrode pads.

5. A semiconductor apparatus comprising:
a semiconductor substrate;
one or more main semiconductor devices on the semiconductor substrate, the main semiconductor devices making a main current flow;
one or more main sensing semiconductor devices on the semiconductor substrate, the sensing semiconductor devices making a sensing current flow for measuring the main current; and
a plurality of the main semiconductor devices exhibiting different current capacities or a plurality of the sensing semiconductor devices exhibiting different current capacities;
wherein,
a combination of a plurality of the main semiconductor devices and a sensing semiconductor device, a combination of a main semiconductor device and a plurality of the sensing semiconductor devices, or a combination of a plurality of the main semiconductor devices and a plurality of the sensing semiconductor devices is selected for setting a sensing ratio that is a ratio between the main current and the sensing current to be constant in a main current range used,
wherein,
at least one of the main semiconductor devices comprises a main MOS transistor comprising a main MOSFET, at least one of the sensing semiconductor devices comprises a sensing MOS transistor comprising a sensing MOSFET or a sensing IGBT, and a design value of the sensing ratio is determined by a ratio between a total area of a source layer or an emitter layer in the main MOS transistor and a total area of a source layer or an emitter layer in the sensing MOS transistor;

the semiconductor apparatus further comprising:

two pieces of the main MOS transistor, the current capacities thereof being different from each other;

two pieces of the sensing MOS transistor, the current capacities thereof being different from each other;

a gate electrode pad common to the main and sensing MOS transistors;

a drain electrode or a collector electrode common to the main and sensing MOS transistors;

source electrodes or emitter electrodes of the two pieces of the main MOS transistor;

source electrodes or emitter electrodes of the two pieces of the sensing MOS transistor; and six terminals connected to the drain electrode or the collector electrode, the source electrodes or the emitter electrodes, and the gate electrode pad.

6. A semiconductor apparatus comprising:

a semiconductor substrate;

one or more main semiconductor devices on the semiconductor substrate, the main semiconductor devices making a main current flow;

one or more main sensing semiconductor devices on the semiconductor substrate, the sensing semiconductor devices making a sensing current flow for measuring the main current; and a plurality of the main semiconductor devices exhibiting different current capacities or a plurality of the sensing semiconductor devices exhibiting different current capacities;

wherein, a combination of a plurality of the main semiconductor devices and a sensing semiconductor device, a combination of a main semiconductor device and a plurality of the sensing semiconductor devices, or a combination of a plurality of the main semiconductor devices and a plurality of the sensing semiconductor devices is selected for setting a sensing ratio that is a ratio between the main current and the sensing current to be constant in a main current range used, wherein, at least one of the main semiconductor devices comprises a main MOS transistor comprising a main MOSFET, at least one of the sensing semiconductor devices comprises a sensing MOS transistor comprising a sensing MOSFET or a sensing IGBT, and a design value of the sensing ratio is determined by a ratio between a total area of a source layer or an emitter layer in the main MOS transistor and a total area of a source layer or an emitter layer in the sensing MOS transistor;

the semiconductor apparatus further comprising:

two pieces of the main MOS transistor, the current capacities thereof being different from each other;

two pieces of the sensing MOS transistor, the current capacities thereof being different from each other;

gate electrode pads of the two pieces of the main MOS transistor;

gate electrode pads of the two pieces of the sensing MOS transistor;

a drain electrode or a collector electrode common to the main and sensing MOS transistor;

a source electrode or an emitter electrode common to the two pieces of the main MOS transistor;

a source electrode or an emitter electrode common to the two pieces of the sensing MOS transistor; and seven terminals connected to the drain electrode or the collector electrode, the source electrodes or the emitter electrodes, and the gate electrode pads.

7. A semiconductor apparatus comprising:

a semiconductor substrate;

a main semiconductor device on the semiconductor substrate, the main semiconductor device making a main current flow;

a plurality of main sensing semiconductor devices on the semiconductor substrate, the sensing semiconductor devices making a sensing current flow for measuring the main current; and a plurality of the sensing semiconductor devices exhibiting different current capacities;

wherein a combination of a main semiconductor device and a plurality of the sensing semiconductor devices is selected for setting a sensing ratio that is a ratio between the main current and the sensing current to be constant in a main current range used;

wherein, the main semiconductor device comprises a main MOS transistor comprising a main MOSFET, at least one of the sensing semiconductor devices comprises a sensing MOS transistor comprising a sensing MOSFET or a sensing IGBT, and a design value of the sensing ratio is determined by a ratio between a total area of a source layer or an emitter layer in the main MOS transistor and a total area of a source layer or an emitter layer in the sensing MOS transistor;

the semiconductor apparatus further comprising:

two pieces of the sensing MOS transistor, the current capacities thereof being different from each other;

a gate electrode pad common to the main and sensing MOS transistors;

a drain electrode or a collector electrode common to the main and sensing MOS transistor;

a source electrode or an emitter electrode of the main MOS transistor;

source electrodes or emitter electrodes of the two pieces of the sensing MOS transistor; and five terminals connected to the drain electrode or the collector electrode, the source electrodes or the emitter electrodes, and the gate electrode pad.

* * * * *